(12) United States Patent
Iwasaki et al.

(10) Patent No.: US 9,735,150 B2
(45) Date of Patent: Aug. 15, 2017

(54) SEMICONDUCTOR DEVICE AND MANUFACTURING METHOD THEREOF

(71) Applicant: TOYOTA JIDOSHA KABUSHIKI KAISHA, Toyota-shi, Aichi-ken (JP)

(72) Inventors: Shinya Iwasaki, Toyota (JP); Satoru Kameyama, Toyota (JP); Yuki Yakushigawa, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/174,337

(22) Filed: Jun. 6, 2016

(65) Prior Publication Data
US 2017/0033099 A1 Feb. 2, 2017

(30) Foreign Application Priority Data
Jul. 30, 2015 (JP) ................ 2015-151331

(51) Int. Cl.
*H01L 29/872* (2006.01)
*H01L 27/06* (2006.01)
*H01L 29/10* (2006.01)
*H01L 29/66* (2006.01)
*H01L 29/739* (2006.01)
(Continued)

(52) U.S. Cl.
CPC ...... *H01L 27/0664* (2013.01); *H01L 29/0619* (2013.01); *H01L 29/1095* (2013.01); *H01L 29/66143* (2013.01); *H01L 29/66348* (2013.01); *H01L 29/7397* (2013.01);
(Continued)

(58) Field of Classification Search
CPC ............. H01L 27/0635; H01L 29/872; H01L 29/7397; H01L 29/66734; H01L 29/66348; H01L 29/1095; H01L 29/0696; H01L 29/7393; H01L 29/7813; H01L 29/7806; H01L 29/66727; H01L 29/1608
USPC ........ 257/140, 155, 498, 328; 438/270, 272, 438/268, 237, 329
See application file for complete search history.

(56) References Cited

U.S. PATENT DOCUMENTS

2007/0210350 A1* 9/2007 Omura ................ H01L 23/4824
257/287
2007/0221952 A1* 9/2007 Thorup ............... H01L 29/7813
257/155
(Continued)

FOREIGN PATENT DOCUMENTS

JP 2013-048230 A 3/2013
JP 2014-192351 A 10/2014

*Primary Examiner* — David Vu
*Assistant Examiner* — Mouloucoulaye Inoussa
(74) *Attorney, Agent, or Firm* — Oliff PLC

(57) ABSTRACT

A semiconductor device includes an interlayer insulating film in which first contact holes and second contact holes are provided. Each of the second contact holes has a width narrower than a width of the corresponding first contact hole. A contact plug is located in the corresponding second contact hole. An upper electrode layer is arranged on an upper surface of the interlayer insulating film, upper surfaces of the contact plugs, and inner surfaces of the first contact holes. The protective insulating film covers an upper surface of the external field. An end portion extending along a direction intersecting with the plurality of trenches of the protective insulating film extends through a range located above the plurality of the second contact holes. A pillar region is in contact with the upper electrode layer in the first contact hole.

5 Claims, 18 Drawing Sheets

(51) Int. Cl.
*H01L 29/06* (2006.01)
*H01L 29/36* (2006.01)

(52) U.S. Cl.
CPC ........ *H01L 29/872* (2013.01); *H01L 29/0623* (2013.01); *H01L 29/36* (2013.01)

(56) References Cited

U.S. PATENT DOCUMENTS

| | | |
|---|---|---|
| 2014/0048847 A1 | 2/2014 | Yamashita et al. |
| 2015/0249083 A1* | 9/2015 | Okawara ............. H01L 27/0635 257/140 |
| 2016/0172301 A1* | 6/2016 | Iwasaki .................. H01L 24/05 257/751 |

* cited by examiner

SEMICONDUCTOR DEVICE AND MANUFACTURING METHOD THEREOF

TECHNICAL FIELD

The technique disclosed herein relates to a semiconductor device and a manufacturing method thereof.

BACKGROUND ART

A diode having a trench provided on an upper surface of a silicon substrate is known. For example, in a semiconductor device having a diode and an IGBT on a single silicon substrate (a so-called RC-IGBT (Reverse conducting insulated gate bipolar transistor)), a trench-type gate electrode is provided in an IGBT field, and an electrode arranged in a trench is provided also in a diode field, similar to the gate electrode. In the diode having such a trench electrode, an interlayer insulating film is arranged to cover an upper surface of the silicon substrate, and an upper electrode layer (anode electrode) is arranged on the interlayer insulating film. The trench electrode is insulated from the upper electrode layer by the interlayer insulating film. Further, a contact hole is provided in the interlayer insulating film, and the upper electrode layer is provided also within the contact hole. The upper electrode layer is connected to the silicon substrate in the contact hole. In the diode having this structure, the contact hole is recessed in a concave shape relative to the upper surface of the interlayer insulating film, and the upper electrode layer is formed along the concave-shaped contact hole. Accordingly, a recess is formed on an upper surface of the upper electrode layer as well. With the recess provided on the upper surface of the upper electrode layer, high thermal stress is more likely to be generated in a vicinity of the recess due to a temperature change upon an operation of the diode. A crack may be generated in the upper electrode layer due to the thermal stress being applied thereto repeatedly.

Japanese Patent Application Publication No. 2014-192351 discloses a semiconductor device that has a substantially flat upper surface of an upper electrode layer. In this semiconductor device, a contact hole with a narrow width is provided in an interlayer insulating film. A thin first metal layer (barrier metal configured of Ti, TiN, etc.) is provided at a bottom of the contact hole. A second metal layer (tungsten) is provided above the first metal layer. The contact hole is filled without any gap by the second metal layer. Since an upper surface of the interlayer insulating film and an upper surface of the second metal layer are arranged at substantially the same height, the aforementioned substantially flat upper surface is configured by these upper surfaces. The upper electrode layer covers the upper surface of the interlayer insulating film and the upper surface of the contact metal layer (that is, the flat surface). Since the upper electrode layer is provided on the flat surface, the upper surface of the upper electrode layer is also flattened. Due to this, the thermal stress is less likely to be generated in the upper electrode layer, and the crack is less likely to be generated. The upper electrode layer is connected to the silicon substrate via these first metal layer and second metal layer. By adapting this technique to the aforementioned diode (diode having trench electrode), the upper electrode layer of the diode can be flattened.

Japanese Patent Application Publication No. 2013-048230 discloses a diode including a barrier region and a pillar region. More specifically, in this diode, an anode region, a barrier region, a pillar region, a drift region, and a cathode region are provided in a silicon substrate. The anode region is a p-type region connected with a low resistance to an upper electrode layer (anode electrode). The barrier region is an n-type region provided under the anode region. The pillar region is an n-type region extending from a position in contact with the upper electrode layer to a position in contact with the barrier region. A high barrier (a so-called Schottky barrier) against current flowing from the pillar region toward the upper electrode layer is present between the pillar region and the upper electrode layer. The drift region is an n-type region provided under the barrier region. An n-type impurity concentration of the drift region is lower than an n-type impurity concentration of the barrier region. The cathode region is provided under the drift region, and is an n-type region connected to a lower electrode layer (cathode electrode). An n-type impurity concentration of the cathode region is higher than the n-type impurity concentration of the drift region.

In the diode of Japanese Patent Application Publication No. 2013-048230, when a potential of the upper electrode layer is increased, electrons start to flow from the lower electrode layer toward the upper electrode layer through the cathode region, the drift region, the barrier region, and the pillar region. That is, the electrons flow in the diode at a point when the potential of the upper electrode layer hasn't fully increased. Since the barrier region is connected to the upper electrode layer via the pillar region, a potential difference between the barrier region and the upper electrode layer is small at this point. Due to this, a potential difference is less likely to occur at a pn junction at an interface between the barrier region and the anode region, and the pn junction does not turn on at this point. When the potential of the upper electrode layer is further increased, the current by the aforementioned electrons increases, and the potential difference between the barrier region and the upper electrode layer becomes larger. When this potential difference reaches a predetermined potential difference, the pn junction at the interface between the barrier region and the anode region turns on, and holes flow into the drift region from the upper electrode layer through the anode region and the barrier region. As above, in this diode, the electrons flow through the barrier region and the pillar region before when the pn junction at the interface between the barrier region and the anode region turns on. Due to this, a timing at which the pn junction turns on is delayed, and the holes are suppressed from flowing into the drift region. Thus, upon a reverse recovery operation of this diode, an amount of holes discharged from the drift region to the upper electrode layer is small. Due to this, in this diode, reverse recovery current is small, and a loss generated upon the reverse recovery operation is suppressed. Further, in a state where a reverse voltage is applied to the diode, due to the presence of the high Schottky barrier between the pillar region and the upper electrode layer, leak current flowing through the pillar region is suppressed.

SUMMARY

The inventors of the present application consider to combine the aforementioned three techniques (that is, the diode including the trench electrode, the technique for planarizing the upper electrode layer, and the diode including the barrier region and the pillar region). When an attempt to combine these three techniques is performed, a problem occurs in a connection between the pillar region and the upper electrode layer. That is, in the case of combining the aforementioned three techniques, a contact hole needs to be provided in the interlayer insulating film, and the upper electrode layer and the pillar region need to be connected through the contact hole. On the other hand, the aforementioned Schottky barrier needs to be provided between the pillar region and the upper electrode layer. Since the first metal layer (barrier metal) provided in a contact portion in the technique of Japanese Patent Application Publication No. 2013-048230 cannot form a Schottky contact with the pillar region (n-type silicon), it cannot be used as the connection with the pillar region. To form the Schottky contact with the pillar region (n-type silicon), a metal (for example, AlSi, etc.) having a specific work function (for example, 4.25 to 5.05 eV) needs to be provided on the pillar region. Here, if a Schottky-contactable metal is provided on the pillar region in a thin film shape, mutual diffusion occurs between the metal and the silicon substrate, as a result of which a desired performance cannot be obtained at an interface thereof. Due to this, the Schottky-contactable metal needs to be provided on the pillar region at a thickness equal to or more than a certain amount. However, those generally known as a Schottky contactable metal do not have satisfactory filling property, and it is difficult to deposit such a substance thickly within the contact hole having the narrow width. When such a metal is deposited thickly in this contact hole having the narrow width, the Contact hole is filled by the metal layer incompletely, and gaps are formed in the contact hole (that is, inside the metal layer). When the gaps are formed in the contact hole, reliability of the semiconductor device cannot be ensured. To avoid this problem, if the width of the contact hole is widened, a recess is formed on an upper surface of the metal, and the upper surface of the upper electrode layer cannot be planarized. Due to this, there has been a problem that cracking of the upper electrode layer cannot be suppressed.

The inventors of the present application found that there are a portion where cracking occurs more frequently and a portion where the cracking does not occur so much in a case where the upper surface of the upper electrode layer is not planarized (that is, in a case where the recess is formed on the upper surface of the upper electrode layer along the contact hole). The portion where the cracking occurs more frequently is in a vicinity of an end of a protective insulating film extending in a direction traversing trenches. That is, in general, the silicon substrate of the diode includes an element field where the diode is provided, and an external field outside the element field. While the upper electrode layer is provided in the element field, the external field is covered by the protective insulating film. The protective insulating film also covers an outer circumferential edge of the upper electrode layer in the element field. Thus, an end of the protective insulating film is provided on the upper electrode layer.

The crack is likely to occur especially in the upper electrode layer at a portion under the end of the protective insulating film extending in a direction intersecting the trenches within the end of the protective insulating film. On the contrary, at positions distant from this portion, it has been found that cracking does not occur so much. The reason why cracking occurs more frequently in the upper electrode layer in the vicinity of the end of the protective insulating film extending in the direction traversing the trenches is considered to be as follows. The end of the protective insulating film is positioned at a boundary between the portion where the upper electrode layer is covered by the protective insulating film and the portion where upper electrode layer is not covered by the protective insulating film. Thus, the upper electrode layer at the portion under the protective insulating film is a portion where a stress distribution changes locally, where high stress is easily generated. Thus, high thermal stress is generated in the upper electrode layer at the portion under the protective insulating film when the temperature change takes place in the diode. On the other hand, since contact holes are provided in the interlayer insulating film in ranges positioned between all the two adjacent trenches, recesses are formed cyclically in the direction traversing the trenches on the upper surface of the upper electrode layer. As aforementioned, the thermal stress occurs more frequently in recesses. Thus, if the end of the protective insulating film extending in the direction traversing the trenches is arranged above the region where the recesses are formed cyclically, extremely high thermal stress is generated in each recess under the protective insulating film, which is assumed to be leading to the generation of the cracks.

As described above, the high thermal stress is generated when the recesses in the upper electrode layer and the end of the protective insulating film (end extending in the direction intersecting with the trenches) are overlapped. In order to avoid such high thermal stress, the end of the protective insulating film may be considered to be laid over a portion where the contact holes do not exist. However, in considering electric performance and heat diffusing performance between the upper electrode layer and the silicon substrate, the contact holes are preferably provided in a range that is as wider as possible. That is, it is preferable to reduce the portion where the contact holes are absent as much as possible. Due to this, the end of the protective insulating film must pass over the contact holes. A semiconductor device disclosed herein comprises the following configuration based on the above findings.

A semiconductor device disclosed herein includes a diode. The semiconductor device comprises a silicon substrate, trench insulating films, trench electrodes, an interlayer insulating film, contact plugs, an upper electrode layer, a protective insulating film, and a lower electrode layer. The silicon substrate is configured so that the silicon substrate comprises an element field and an external field. A plurality of trenches extending in a striped pattern is provided in an upper surface of the silicon substrate in the element field. The external field is adjacent to the element field in a longitudinal direction of the trenches. The silicon substrate comprises a plurality of inter-trench ranges. Each of the inter-trench ranges is provided in each of positions between the two neighboring trenches in a plan view of the upper surface of the silicon substrate. A plurality of specific inter-trench ranges is selected from among the plurality of the inter-trench ranges. Each of the specific inter-trench ranges comprises an anode region, a barrier region and a pillar region. Each of the anode regions is a p-type semiconductor region exposed on the upper surface of the silicon substrate. Each of the barrier regions is an n-type semiconductor region located under the anode region. Each of the pillar regions is an n-type semiconductor region extending from a position exposed on the upper surface of the silicon substrate to a position being in contact with the barrier region. The silicon substrate comprises a drift region and a cathode region located on a lower side with respect to the barrier regions. The drift region is located under the barrier regions, connected to the barrier regions directly or via a p-type semiconductor region, and having an impurity concentration lower than an impurity concentration of the barrier regions. The cathode region is an n-type semiconductor region located under the drift region, exposed on a lower surface of the silicon substrate, and having an impurity concentration higher than the impurity concentration of the drift region. Each of the trench insulating films covers an inner surface of the corresponding trench. Each of the trench electrodes is located in the corresponding trench of which inner surface is covered by the trench insulating film. The interlayer insulating film covers the upper surface of the silicon substrate in the element filed and upper surfaces of the trench electrodes. A first contact hole and a second contact hole penetrating the interlayer insulating film are provided in each of the specific inter-trench ranges. Each of the second contact holes is located in a position closer to the external field than the corresponding first contact hole. Each of the second contact holes has a width narrower than a width of the corresponding first contact hole. Each of the contact plugs is located in the corresponding second contact hole. The contact plug comprises a first metal layer being in contact with the upper surface of the silicon substrate and a second metal layer located on the first metal layer. The upper electrode layer covers an upper surface of the interlayer insulating film, upper surfaces of the second metal layers, and inner surfaces of the first contact holes. The upper electrode layer has a thickness greater than a thickness of the first metal layers. The protective insulating film covers an upper surface of the external field and a part of the upper electrode layer. The protective insulating film comprises an end portion extending on the upper electrode layer through a range located above the plurality of the second contact holes along a direction intersecting with the plurality of trenches. The lower electrode layer covers the lower surface of the silicon substrate. The anode regions are in contact with the first metal layer by ohmic contact. The pillar regions are in contact with the upper electrode layer by Schottky contact and not in contact with the first metal layer. The cathode region is in contact with the lower electrode layer.

Notably, the width of the first contact hole (or the second contact hole) refers to a size along a short direction of the first contact hole (or the second contact hole) when the silicon substrate is seen in the plan view. Further, the element field may have an IGBT and a diode provided in partitions, or the IGBT and the diode may exist in a mixed arrangement. For example, a p-type body region of the IGBT and the p-type anode region of the diode may be configured as a mutual region. Further, the aforementioned specific inter-trench ranges refer to inter-trench ranges in which all of the first contact hole, the second contact hole, the anode region, the barrier region, and the pillar region are provided. All of the inter-trench ranges may be the specific inter-trench ranges. Further, one or more of the inter-trench ranges may not be the specific inter-trench ranges. That is, one or more of the inter-trench ranges may not have to have one or more of the first contact hole, the second contact hole, the anode region, the barrier region, and the pillar region.

In this semiconductor device, the first contact holes with the wider width and the second contact holes with the narrower width are provided in the interlayer insulating film. The contact plugs making contact with the anode region are provided in the second contact holes. The first metal layer (metal layer arranged at a portion making contact with the silicon substrate) of each contact plug makes ohmic contact with the anode region (p-type silicon). Due to a thickness of the first metal layers being thick, the first metal layers can suitably be arranged in the second contact holes despite the width of the second contact holes being narrow. Further, metal with high filling performance can be employed for the second metal layers on the first metal layers without giving consideration to an influence to the silicon substrate (whether an ohmic contact is to be made or not, whether the constituent material will diffuse into the silicon substrate or not, etc.). Thus, the second contact holes with the narrow width can be filled without any gap using the second metal layers. Due to this, upper surfaces of the second metal layers and an upper surface of the interlayer insulating film can be made flat relatively easily. Accordingly, the upper surface of the upper electrode layer becomes relatively flat above the contact plugs.

On the other hand, in the first contact holes, the upper electrode layer configured of metal making Schottky contact to the pillar regions is arranged therein. Further, a thickness of the upper electrode layer is thicker than the thickness of the first metal layers. Since the upper electrode layer has such a thickness as above, mutual diffusion at interfaces between the upper electrode layer and the silicon substrate can be suppressed. Further, since a Schottky barrier is generated at the interfaces, leak current flowing through the pillar region in a state where a reverse voltage is being applied to the diode can be suppressed. Further, since the width of the first contact hole is wide, a thick upper electrode layer can be arranged within the first contact hole. That is, gaps are hardly formed within the first contact holes. Further, since the width of the first contact holes is wide, recesses that follow the shape of the first contact holes are formed on the upper surface of the upper electrode layer.

As described above, the upper surface of the upper electrode layer is flat at the positions of the second contact holes, and the upper surface of the upper electrode layer has the recesses at the positions of the first contact holes. In this diode, an end of the protective insulating film (more specifically, an end extending in a direction intersecting the trenches) extends above the second contact holes (that is, through the flat regions). That is, the recesses and the end of the protective insulating film are arranged so as not to overlap. Accordingly, an extremely high thermal stress is prevented from being generated in the upper electrode layer, and cracks are less likely to occur.

As above, according to the semiconductor device, the leak current in the diode is suppressed and the cracking of the upper electrode layer can also be suppressed.

Further, the description herein provides a method for manufacturing a semiconductor device including a diode. The method comprises: preparing a silicon substrate, forming an interlayer insulating film, forming first contact holes and second contact holes, forming a first metal layer, forming a second metal layer, forming an upper electrode layer, forming a protective insulating film, forming an n-type cathode region, and forming a lower electrode layer. In the preparation of the silicon substrate, the silicon substrate having the following configuration is prepared: the silicon substrate comprises an element field and an external field; a plurality of trenches extending in a striped pattern is provided in an upper surface of the silicon substrate in the element field; and the external field is adjacent to the element field in a longitudinal direction of the trenches. Each of the trench insulating films covers an inner surface of corresponding trench. Each of the trench electrodes is located in the corresponding trench of which inner surface is covered by the trench insulating film. The silicon substrate comprises a plurality of inter-trench ranges. Each of the inter-trench ranges is provided in each of positions between the two neighboring trenches in a plan view of the upper surface of the silicon substrate. A plurality of specific inter-trench ranges is selected from among the plurality of the inter-trench ranges. Each of the specific inter-trench ranges comprises an anode region, a barrier region and a pillar region. Each of the anode regions is a p-type semiconductor region exposed on the upper surface of the silicon substrate. Each of the barrier regions is an n-type semiconductor region located under the anode region. Each of the pillar regions is an n-type semiconductor region extending from a position exposed on the upper surface of the silicon substrate to a position being in contact with the barrier region. The silicon substrate comprises a drift region located under the barrier regions, connected to the barrier regions directly or via a p-type semiconductor region, and having an impurity concentration lower than an impurity concentration of the barrier regions. In the formation of the interlayer insulating film, the interlayer insulating film covering the upper surface of the silicon substrate in the element filed and upper surfaces of the trench electrodes is formed. In the formation of the contact holes, the first contact holes and the second contact holes penetrating the interlayer insulating film in each of the specific inter-trench ranges is formed. Each of the second contact holes being located in a position closer to the external field than the corresponding first contact hole. Each of the second contact holes has a width narrower than a width of the corresponding first contact hole. Each of the pillar regions is exposed on a bottom surface of the corresponding first contact hole. Each of the anode regions is exposed on a bottom surface of the corresponding second contact hole. The pillar regions are not exposed on the bottom surfaces of the second contact holes. In the formation of the first metal layer, the first metal layer being in contact with the corresponding anode region by ohmic contact is formed on the bottom surface of the corresponding second contact hole. In the formation of the second metal layer, the second metal layer is formed on the corresponding first metal layer by CVD after the formation of the first metal layers. In the formation of the upper electrode layer, the upper electrode layer is formed on an upper surface of the interlayer insulating film, upper surfaces of the second metal layers, and inner surfaces of the first contact holes after the formation of the second contact holes. The upper electrode layer has a thickness greater than a thickness of the first metal layers. The upper electrode layer is in contact with the pillar regions by Schottky contact in the first contact holes. In the formation of the protective insulating film, the protective insulating film covering an upper surface of the external field and a part of the upper electrode layer is formed. The protective insulating film comprises an end portion extending on the upper electrode layer through a range located above the plurality of the second contact holes along a direction intersecting with the plurality of trenches. In the formation of the n-type cathode region, the cathode region located under the drift region, exposed on a lower surface of the silicon substrate, and having an impurity concentration higher than an impurity concentration of the drift region is formed. In the formation of the lower electrode layer, the lower electrode layer being in contact with the cathode region on the lower surface of the silicon substrate is formed.

Notably, so long as no contradiction occurs, order in which these steps are carried out can freely be changed. For example, the formation of the cathode region and the formation of the lower electrode layer may be performed prior to the formation of the interlayer insulating film, may be performed after the formation of the front surface electrode layer, or may be performed at some other timing.

In this manufacturing method, the first metal layers are formed in the second contact holes. Although the width of the second contact holes is narrow, the first metal layers can suitably be formed in the second contact holes due to the thickness of the first metal layers being small. The second metal layers are formed on the first metal layers (that is, in the second contact holes) after the formation of the first metal layers. By using CVD, the second metal layers can suitably be formed in the second contact holes having the narrow width. Accordingly, gaps are less likely to be formed in the second contact holes. The upper electrode layer is formed after the formation of the second metal layers. Here, the upper electrode layer is formed thickly over the interlayer insulating film, over the second metal layers, and in the first contact holes. Since the second metal layers are formed in the second contact holes, an upper surface of the upper electrode layer becomes relatively flat above the second contact holes. Further, since the width of the first contact hole is wide, a thick upper electrode layer can be arranged within the first contact hole. That is, gaps are hardly formed within the first contact holes. Further, since the width of the first contact holes is wide, gaps are less likely to be generated in the first contact holes even if the upper electrode is formed thickly within the first contact holes. Further, since the width of the first contact holes is wide, recesses are formed on the upper surface of the upper electrode layer at positions corresponding to the first contact holes. Then, in the formation of the protective insulating film, the protective insulating film is formed. Here, the protective insulating film is formed so that the end of the protective insulating film extending in the direction intersecting with the trenches on the upper electrode layer extends over the second contact holes. The end of the protective insulating film is arranged above the second contact holes (flat region). Then, the front surface electrode layer, the cathode region, and the lower electrode layer are formed. According to this method, the end of the protective insulating film extending in the direction intersecting with the trenches will be arranged on the flat upper electrode layer (over the second contact holes), so a high thermal stress can be suppressed from being applied to the upper electrode layer. Further, since the upper electrode layer makes Schottky contact with the pillar regions, the leak current flowing through the pillar regions can be suppressed.

DETAILED DESCRIPTION

Figure 1:
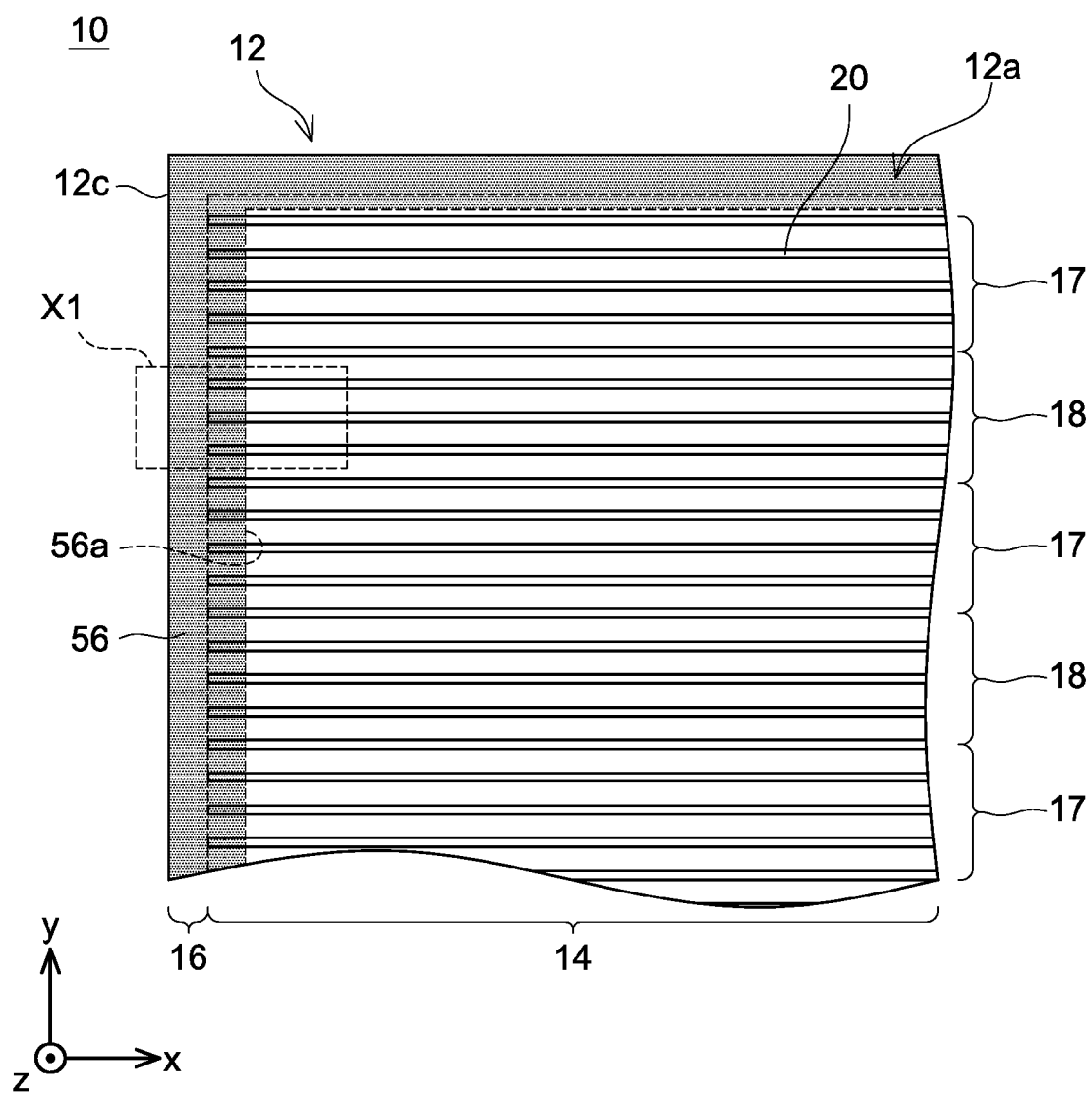
FIG. 1 is a plan view of a semiconductor device 10 indicating arrangements of trenches 20 and a protective insulating film 56.

As shown in FIG. 1, a semiconductor device 10 comprises a silicon substrate 12. Notably, an upper surface 12a of the silicon substrate 12 is covered by insulating film, electrode, and the like, however, in FIG. 1, such structures are omitted for clearer explanation. Further, in the description below, a thickness direction of the silicon substrate 12 will be termed a z direction, one direction parallel to the upper surface 12a of the silicon substrate 12 (one direction vertically intersecting the z direction) will be termed an x direction, and a direction parallel to the upper surface 12a of the silicon substrate 12 and vertically intersecting the x direction will be termed a y direction. As shown in FIG. 1, a plurality of trenches 20 is provided on the upper surface 12a of the silicon substrate 12. Each of the trenches 20 extends parallel to each other on the upper surface 12a. Each of the trenches 20 extends longitudinally along the x direction on the upper surface 12a. The plurality of trenches 20 is arranged with intervals in between along the y direction. Hereinbelow, a region where the plurality of trenches 20 is provided when the upper surface 12a of the silicon substrate 12 is seen in a plan view will be called an element field 14. Further, a region on the outer side of the element field 14 (region between the element field 14 and the end surface 12c of the silicon substrate 12) when the upper surface 12a of the silicon substrate 12 is seen in the plan view will be called an external field 16. The element field 14 includes an IGBT field 17 and a diode field 18. The IGBT field 17 has an IGBT provided therein. The diode field 18 has a diode provided therein. The IGBT field 17 and the diode field 18 are arranged so as to be alternately arranged along the y direction.

Figure 2:
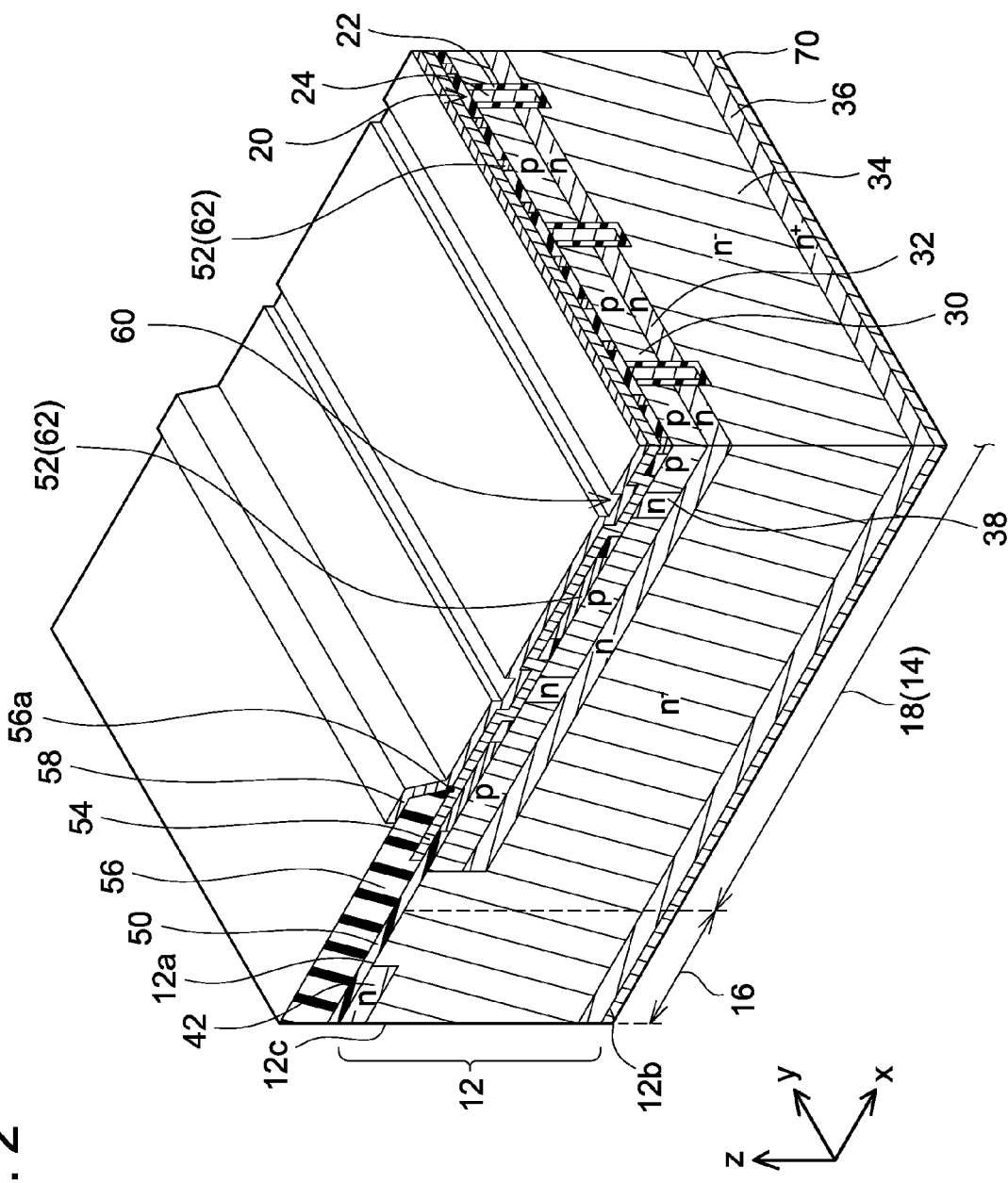
FIG. 2 is a cross sectional perspective view of a portion shown within a range X1 of FIG. 1.
Figure 3:
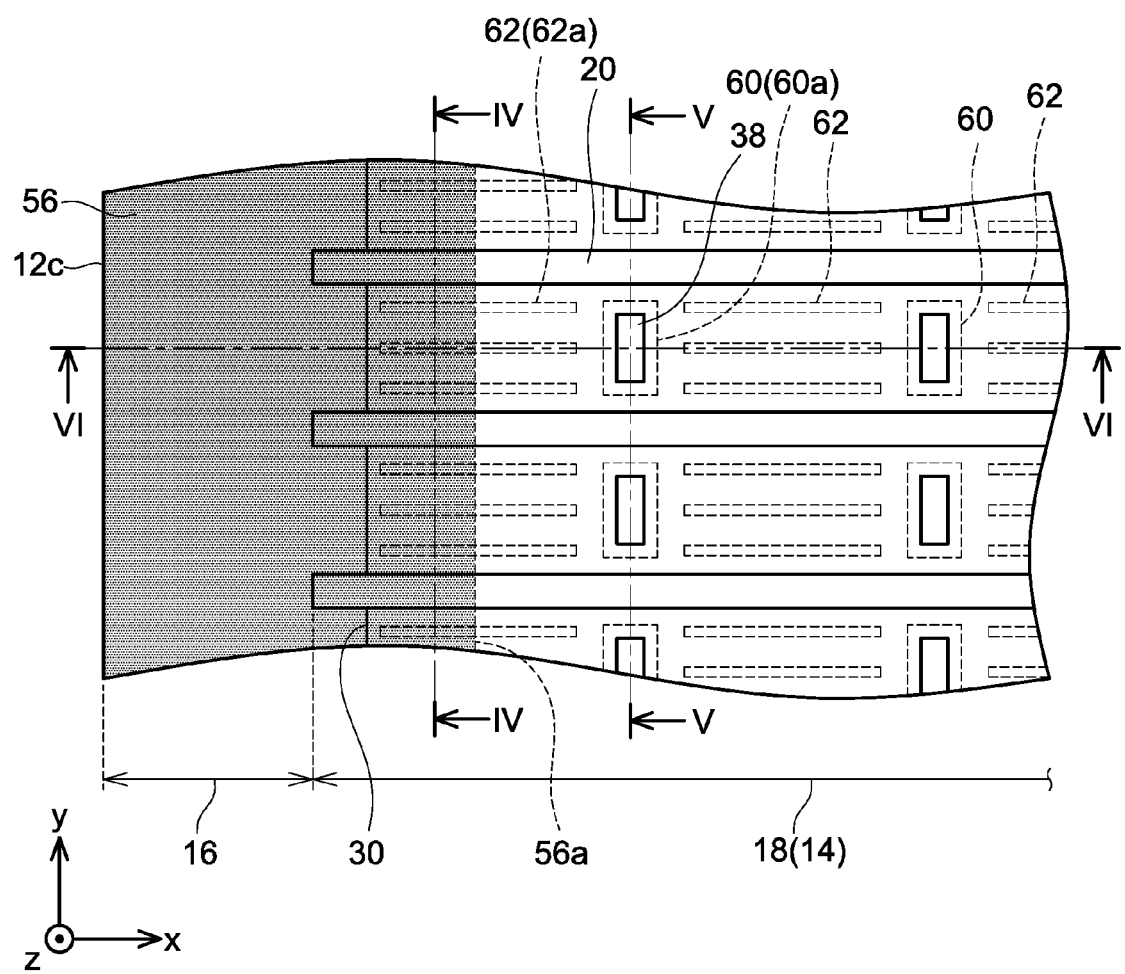
FIG. 3 is a plan view of the portion shown within the range X1 of FIG. 1.
Figure 4:
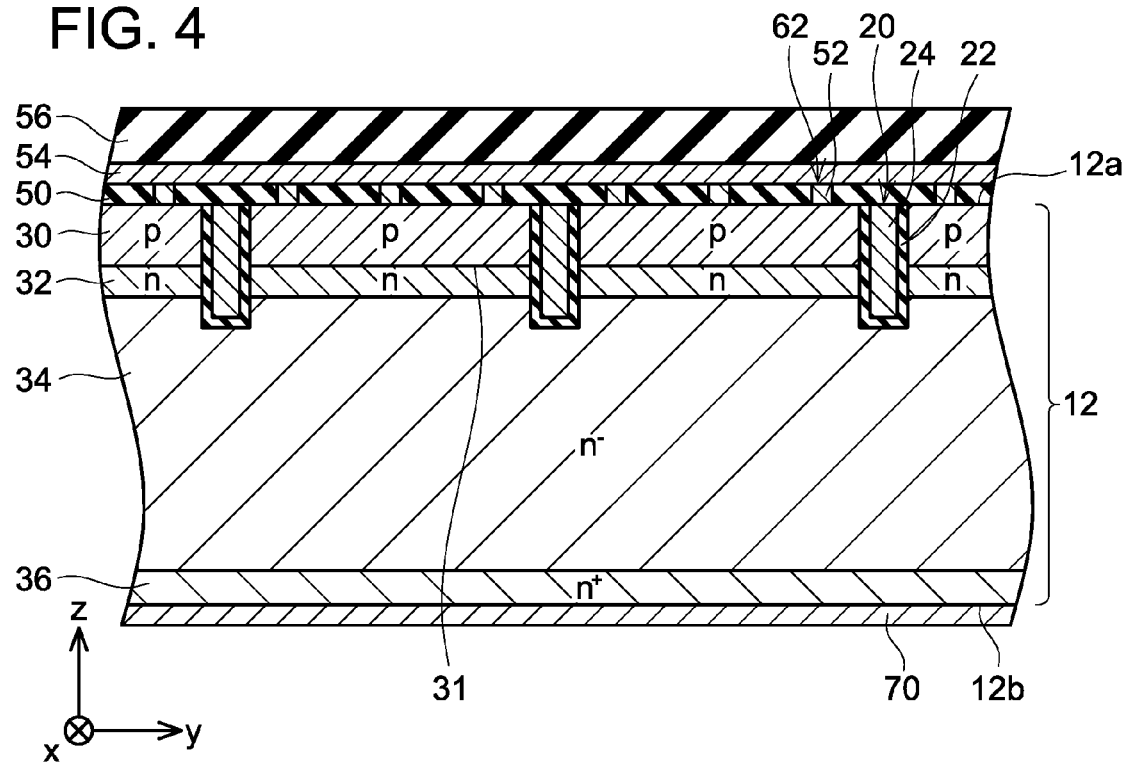
FIG. 4 is a vertical cross sectional view along a line IV-IV in FIG. 3.
Figure 5:
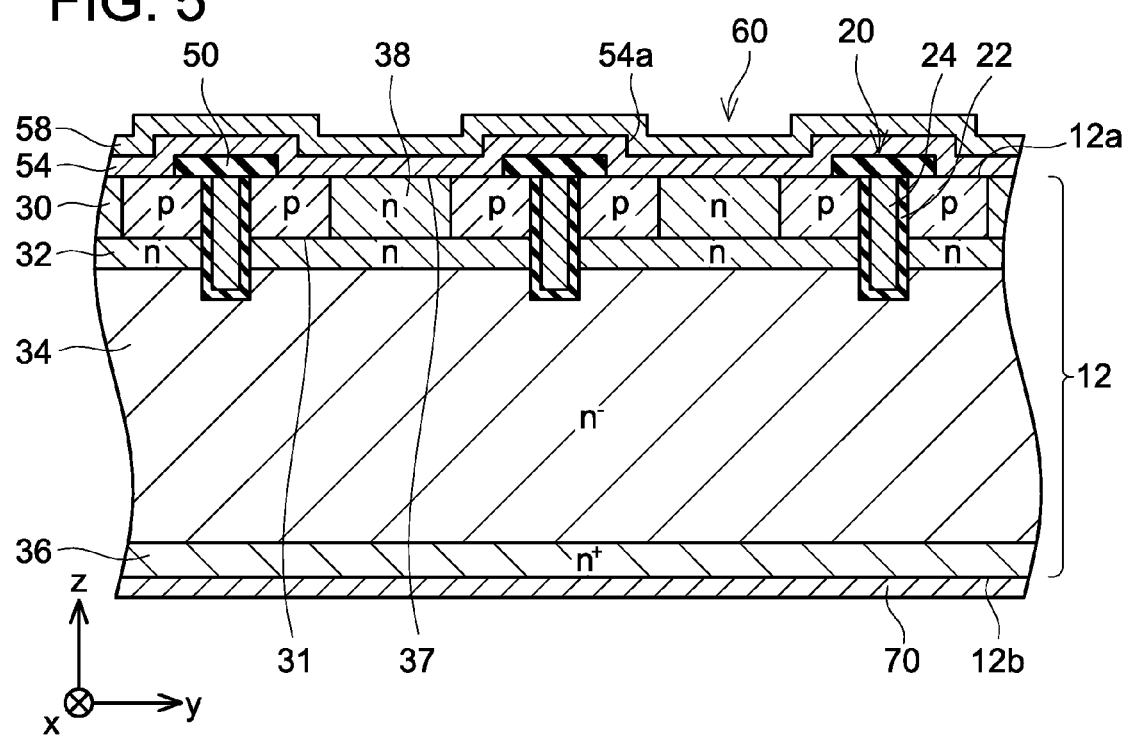
FIG. 5 is a vertical cross sectional view along a line V-V in FIG. 3.
Figure 6:
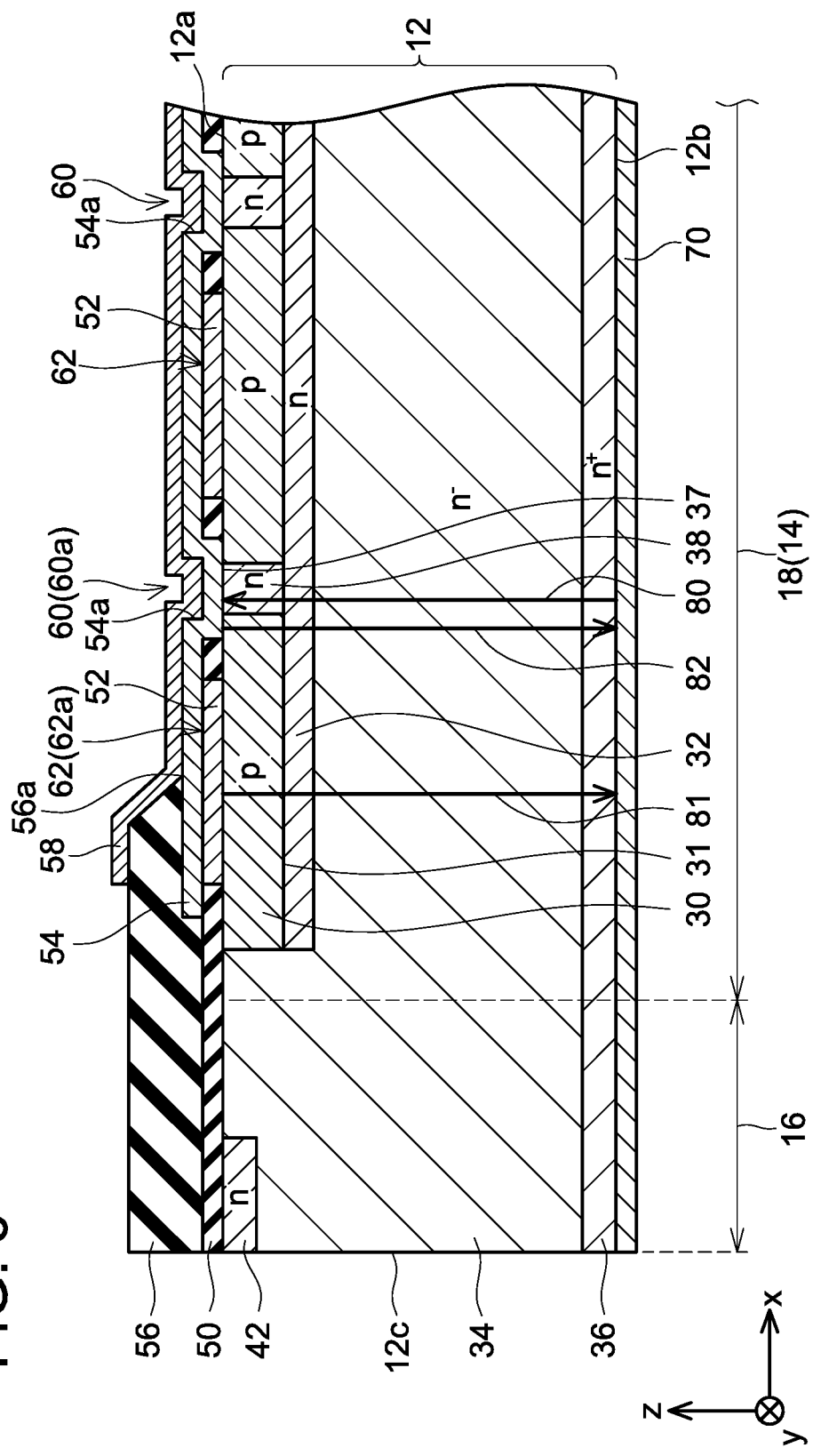
FIG. 6 is a vertical cross sectional view along a line VI-VI in FIG. 3.

FIG. 2 shows a perspective view of a portion within a range X1 in FIG. 1. Further, FIG. 3 shows a plan view of the upper surface 12a of the silicon substrate 12 in the portion within the range X1. Notably, in FIG. 3, depiction of the electrode and the insulating film above the upper surface 12a of the silicon substrate 12 is partially omitted. Further, FIGS. 4 to 6 show cross sectional views of the semiconductor device 10 at the portion within the range X1. In the range X1, a diode field 18, and an external field 16 that is adjacent to the diode field 18 in a longitudinal direction of the trenches 20 (x direction) are included.

As shown in FIGS. 2 to 6, the trenches 20 extend downward from the upper surface 12a (in the z direction). An inner surface of each trench 20 is covered by a trench insulating film 22. A trench electrode 24 is arranged within each trench 24. Each trench electrode 24 is insulated from the silicon substrate 12 by the corresponding trench insulating film 22.

The upper surface 12a of the silicon substrate 12 is covered by an interlayer insulating film 50. The interlayer insulating film 50 covers the upper surface 12a of the silicon substrate 12 in the element field 14 and the external field 16. The interlayer insulating film 50 also covers upper surfaces of the trench electrodes 24. The interlayer insulating film 50 is configured of $SiO_2$ (silicon dioxide). Contact holes 60 and contact holes 62 are provided in the interlayer insulating film 50. As shown in FIG. 3, the contact holes 60 and the contact holes 62 are provided in each of ranges sandwiched by the trenches 20 (inter-trench ranges). No contact hole is provided above the trenches 20. In each of the inter-trench ranges, a region where three contact holes 62 are present and a region where one contact hole 60 is present appear alternately in the x direction. In the region where three contact holes 62 are present, three contact holes 62 are arranged along the y direction with intervals in between. Each of the contact holes 62 extends longitudinally along the x direction on the upper surface 12a of the silicon substrate 12. A width of each of the contact holes 62 (that is, its size in the y direction) is narrow. Each of the contact holes 60 has a size in the y direction larger than its size in the x direction. A width of each of the contact holes 60 (that is, its size in the x direction) is wider than the width of each of the contact holes 62 (that is, the size in the y direction). The contact hole 62a positioned closest to the external field 16 is arranged on an external field 16 side than the contact hole 60a positioned closest to the external field 16. The arrangements of the contact holes 60, 62 are identical among the inter-trench ranges. Thus, the positions of the contact holes 62a positioned closest to the external field 16 in the x direction are identical among the inter-trench ranges. Thus, the contact holes 62a of the respective inter-trench ranges are aligned in a line along the y direction. Similarly, the positions of the contact holes 60a positioned closest to the external field 16 in the x direction are identical among the inter-trench ranges. Thus, the contact holes 60a of the respective inter-trench ranges are aligned in a line along the y direction. The other contact holes 60, 62 are arranged similarly. As shown in FIGS. 4 to 6, the contact holes 60, 62 penetrate the interlayer insulating film 50 from its upper surface to its lower surface.

Figure 7:
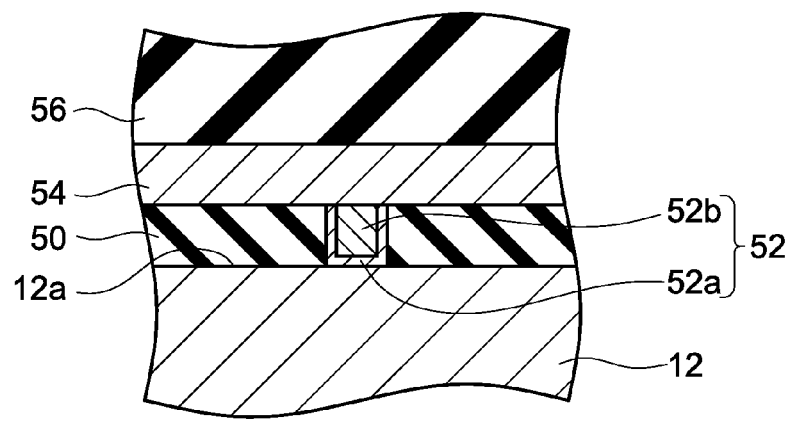
FIG. 7 is an enlarged cross sectional view of a contact plug 52.

As shown in FIGS. 4 and 6, contact plugs are provided in the contact holes 62. FIG. 7 shows an enlarged cross sectional view of a contact plug 52. Each contact plug 52 comprises a barrier metal 52a and a fill-metal layer 52b. Each barrier metal 52a comprises a Ti layer configured of Ti (titanium), and a TiN layer configured of TiN (titanium nitride). The Ti layer makes contact with the silicon substrate 12, and the TiN layer is deposited on the Ti layer. The fill-metal layers 52b are configured of W (tungsten). The fill-metal layers 52h are filled without any gap in a space on an upper side of the barrier metals 52a in the corresponding contact holes 62. Upper surfaces of the fill-metal layers 52h and an upper surface of the interlayer insulating film 50 are arranged at a substantially same height. Accordingly, a substantially flat surface is configured by the upper surfaces of the fill-metal layers 52h and the upper surface of the interlayer insulating film 50.

As shown in FIGS. 4 to 6, an upper electrode layer 54 is provided over the interlayer insulating film 50, over the contact plugs 52, and in the contact holes 60. The upper electrode layer 54 is configured of AlSi (aluminum silicon). The upper electrode layer 54 covers the upper surface of the interlayer insulating film 50, the upper surfaces of the contact plugs 52, and inner surfaces of the contact holes 60 over substantially an entire region of the element field 14. The upper electrode layer 54 makes contact with the silicon substrate 12 in the contact holes 60. The upper electrode layer 54 is insulated from the respective trench electrodes 24 by the interlayer insulating film 50. Recesses 54a are provided on the upper surface of the upper electrode layer 54 following the shapes of the contact holes 60. On the other hand, since the contact holes 62 are filled with the contact plugs 52, the upper surface of the upper electrode layer 54 above the contact holes 62 is substantially flat. Due to this, in a cross section traversing across the contact holes 62 in the y direction see FIG. 4), the flatness of the upper surface of the upper electrode layer 54 is superior than in a cross section traversing across the contact holes 60 in the y direction (see FIG. 5).

As shown in FIGS. 2 and 6, a protective insulating film 56 is provided on the interlayer insulating film 50 in the external field 16. The protective insulating film 56 is configured of polyimide. A range darkened by dots in FIGS. 1 and 3 indicates a range of the protective insulating film 56. As shown in FIGS. 1 and 3, the protective insulating film 56 is provided also in the element field 14 in the vicinity of the external field 16. As shown in FIGS. 2 and 6, the protective insulating film 56 in the element field 14 is provided on the upper electrode layer 54. That is, a portion of the upper electrode layer 54 in the vicinity of the external field 16 is covered by the protective insulating film 56. As shown in FIG. 3, in the range X1, the end 56a of the protective insulating film 56 on the upper electrode layer 54 extends in the y direction. That is, the end 56a extends to intersect with plural trenches 20 when the upper surface 12a is seen in a plan view. The end 56a extends in the y direction by passing above the contact holes 62a positioned at positions closest to the external field 16.

As shown in FIGS. 2, 4, 5, and 6, the front surface electrode layer 58 is provided on the upper electrode layer 54. The front surface electrode layer 58 is configured of Ni (nickel). The front surface electrode layer 58 covers an entirety of the upper surface of the upper electrode layer 54 in a range not covered by the protective insulating film 56. Further, a portion in the vicinity of an outer circumferential edge of the front surface electrode layer 58 is arranged on the protective insulating film 56. That is, the portion of the protective insulating film 56 in the vicinity of the element field 14 is covered by the front surface electrode layer 58. Accordingly, at the end 56a of the protective insulating film 56, the three layers, namely the protective insulating film 56, the upper electrode layer 54, and the front surface electrode layer 58 make contact with each other.

The lower electrode layer 70 is provided over an entirety of a lower surface 12b of the silicon substrate 12.

As shown in FIG. 2, anode regions 30, barrier regions 32, pillar regions 38, a drift region 34, and a cathode region 36 are provided in the silicon substrate 12 in the diode field 18.

The anode regions 30 are p-type regions, and are provided so as to be exposed on the upper surface 12a of the silicon substrate 12. The anode regions 30 are exposed on the upper surface 12a of the silicon substrate 12 over substantially an entire region of the diode field 18 except at ranges where the pillar regions 38 are provided. Each of the anode regions 30 makes contact with the contact plug 52 (that is, the barrier metal 52a) in the corresponding contact hole 62, and makes contact with the upper electrode layer 54 in the corresponding contact hole 60. An impurity concentration of each of the anode regions 30 is higher in a range exposed on the upper surface 12a than in a range located thereunder. Each of the anode regions 30 makes contact with the contact plug 52 and the upper electrode layer 54 with low resistance. That is, each of the anode regions 30 makes ohmic contact with the barrier metal 52a in the contact plug 52 and the upper electrode layer 54. Further, each of the anode regions 30 makes contact with the trench insulating films 22.

Each of the barrier regions 32 is an n-type region, and is provided under the anode region 30. Each of the barrier regions 32 makes contact with the anode region 30 from below. Each of the barrier regions 32 makes contact with the trench insulating films 22 at positions under the anode region 30.

The pillar regions 38 are n-type regions. As shown in FIG. 3, the pillar regions 38 are provided so as to be exposed on the upper surface 12a of the silicon substrate 12 in the contact holes 60. The pillar regions 38 make contact with the upper electrode layer 54 in the contact holes 60. As shown in FIGS. 5 and 6, each of the pillar regions 38 extends from a position making contact with the upper electrode layer 54 to a position making contact with the barrier region 32. That is, the pillar regions 38 penetrate the anode region 30 in the z direction. An n-type impurity concentration of the pillar regions 38 is adjusted to a concentration in a range of $1\times10^{15}$ to $1\times10^{19}$ atoms/cm$^3$. Further, the pillar regions 38 have the upper electrode layer 54 made of AlSi provided thickly thereon. Due to this, the pillar regions 38 make Schottky contact with the upper electrode layer 54. Interfaces 37 between the pillar regions 38 and the upper electrode layer 54 have a high barrier provided therein against a current flowing from the pillar regions 38 toward the upper electrode layer 54. The barrier of the interfaces 37 is extremely small for a current in an opposite direction. The pillar regions 38 are arranged at positions separated away from the contact holes 62, and thus do not make contact with the contact plugs 52. Thus, the pillar regions 38 are connected to the upper electrode layer 54 only within the contact holes 60.

The drift region 34 is an n-type region with a lower n-type impurity concentration than the pillar regions 38 and the barrier region 32. The drift region 34 is provided under the barrier regions 32, and makes contact with the barrier regions 32 from below.

The cathode region 36 is an n-type region with a higher n-type impurity concentration than the drift region 34, the pillar regions 38, and the barrier regions 32. The cathode region 36 is provided under the drift region 34, and makes contact with the drift region 34 from below. The cathode region 36 is exposed on the lower surface 12b of the silicon substrate 12. The cathode region 36 makes contact with a low resistance to the lower electrode layer 70. That is, the cathode region 36 makes an ohmic contact with the lower electrode layer 70.

As shown in FIG. 2, the drift region 34, the cathode region 36, and an outer circumferential n-type region 42 are provided inside the silicon substrate 12 in the external field 16. The cathode region 36 in the external field 16 is exposed on the lower surface 12b of the silicon substrate 12, similar to the cathode region 36 in the diode field 18. The outer circumferential n-type region 42 is provided at a position exposed on both an end surface 12c and the upper surface 12a of the silicon substrate 12. In the external field 16, the drift region 34 is provided over substantially an entirety of a region between the outer circumferential n-type region 42 and the cathode region 36.

Figure 8:
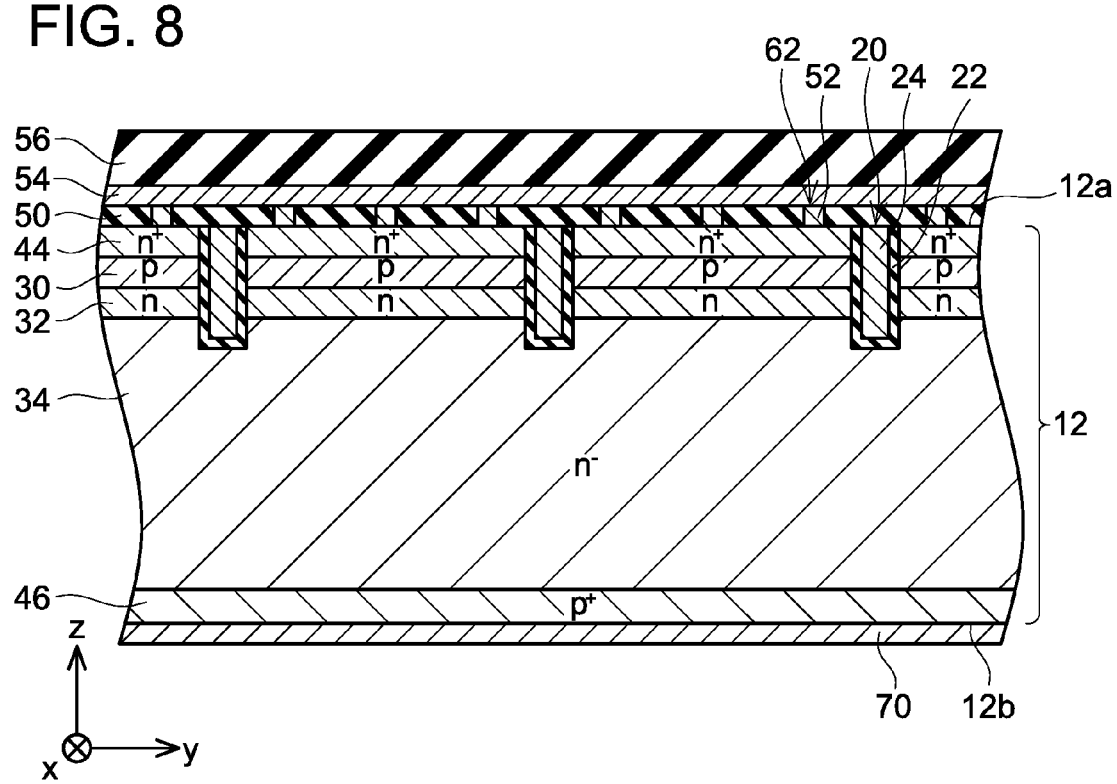
FIG. 8 is a vertical cross sectional view of an IGBT field 17 in a y direction.
Figure 9:
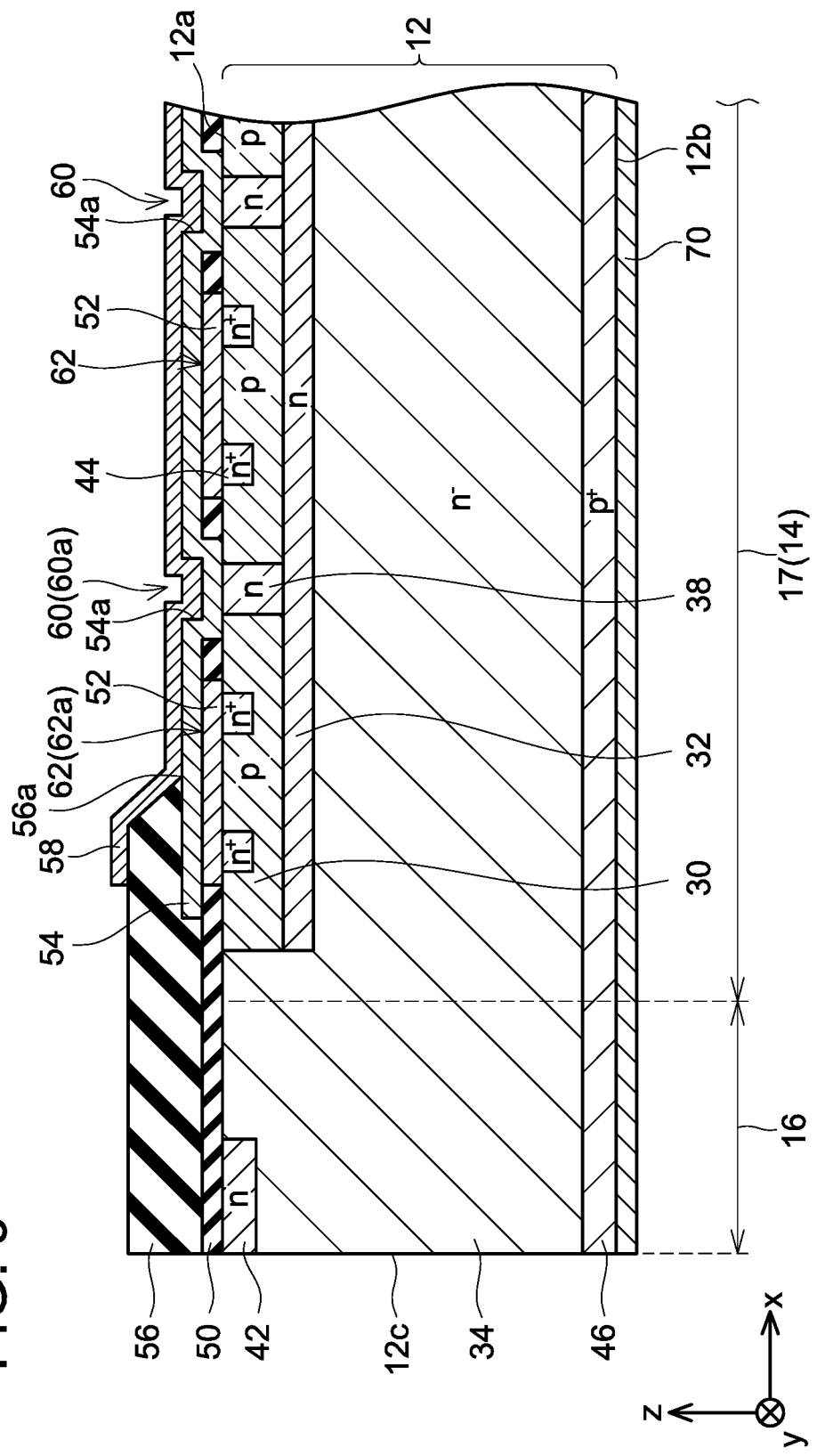
FIG. 9 is a vertical cross sectional view of the IGBT field 17 in an x direction.

FIGS. 8 and 9 show vertical cross sectional views of the silicon substrate 12 in the IGBT field 17. As shown in FIGS. 8 and 9, a structure of the IGBT field 17 differs from the structure of the diode field 18 in that it comprises an emitter region 44 and a collector region 46. Other structures of the IGBT field 17 are identical to the structures of the diode field 18.

The emitter region 44 is provided in the silicon substrate 12 in the IGBT field 17. The emitter region 44 is an n-type region, and is provided partially in a range exposed on the upper surface 12a of the silicon substrate 12. The emitter region 44 makes contact with the contact plugs 52 with a low resistance. That is, the emitter region 44 makes ohmic contact with the contact plugs 52. The anode region 30 is provided under the emitter region 44. The emitter region 44 is separated from the barrier region 32 by the anode region 30. As shown in FIG. 8, the emitter region 44 makes contact with the trench insulating films 22 at positions above the anode region 30. Notably, channels are formed in the anode region 30 in the IGBT field 17 when the IGBT turns on. Thus, the anode region 30 in the IGBT field 17 may be termed a body region. Further, the trench electrodes 24 in the IGBT field 17 are electrodes for forming the channels in the anode region 30 (body region), and may be termed gate electrodes. The trench electrodes 24 (that is, gate electrodes) in the IGBT field 17 may be connected to the trench electrodes 24 in the diode field 18, or may be separated from the trench electrodes 24 in the diode field 18 (that is, the gate electrodes may be configured capable of controlling potentials independent from the trench electrodes 24 in the diode field 18). Further, the trench insulating films 22 in the IGBT field 17 may be termed gate insulating films.

The collector region 46 is provided in the IGBT field 17 instead of the cathode region 36. The collector region 46 is a p-type region, and is provided in a range exposed to the lower surface 12b of the silicon substrate 12 in the IGBT field 17. The collector region 46 makes contact with the lower electrode layer 70 with a low resistance. That is, the collector region 46 makes ohmic contact with the lower electrode layer 70.

Next, an operation of the semiconductor device 10 will be described. Upon using the semiconductor device 10, the front surface electrode layer 58 is connected to an external terminal via a solder layer. The front surface electrode layer 58 is a layer for improving wettability relative to the solder layer. Further, the lower electrode layer 70 is connected to another external terminal via a solder layer.

Firstly, an IGBT operation will be described. In the IGBT operation, a potential higher than that for the upper electrode layer 54 is applied to the lower electrode layer 70. When a potential of the gate electrodes 24 (that is, the trench electrodes 24 in the IGBT field 17) is increased to a potential equal to or greater than a threshold, the channels are formed in the body region 30 (that is, the anode region 30 in the IGBT field 17) in the ranges making contact with the gate insulating films 22. Accordingly, the IGBT turns on, and a current flows from the lower electrode layer 70 to the upper electrode layer 54. When the potential of the gate electrodes 24 is brought down to a potential lower than the threshold, the channels disappear, and the IGBT turns off. Notably, when the IGBT turns off, the drift region 34 is depleted and a high electric field is generated in the drift region 34. If the trench electrodes 24 are provided not only in the IGBT field 17 but also in the diode field 18, the electric field can be distributed relatively evenly over the entireties of the IGBT field 17 and the diode field 18. Due to this, the electric field is suppressed from concentrating locally within the drift region 34.

Next, a diode operation will be described. A forward voltage is applied to the diode in the diode field 18 when the potential of the upper electrode layer 54 is higher than the potential of the lower electrode layer 70, and a reverse voltage is applied to the diode when the potential of the lower electrode layer 70 is higher than the potential of the upper electrode layer 54.

Firstly, the operation upon the forward voltage application will be described. In a state where a relatively low forward voltage is being applied, as shown by an arrow 80 in FIG. 6, electrons flow through the interfaces 37. More specifically, the electrons flow from the lower electrode layer 70 to the upper electrode layer 54 through the cathode region 36, the drift region 34, the barrier region 32, and the pillar regions 38. That is, the current flows in an opposite direction of the arrow 80. During when this current is small, the potential of the barrier region 32 is substantially equal to the potential of the upper electrode layer 54. Thus, a voltage applied to a pn junction 31 at an interface of the anode region 30 and the barrier region 32 is small, and at this stage, the pn junction 31 does not turn on. When the forward voltage becomes large, the current of the arrow 80 becomes large, and the voltage applied to the pn junction 31 becomes large. Thus, when the forward voltage becomes larger than a predetermined value, the pn junction 31 turns on and the current flows as shown by the arrows 81, 82 in FIG. 6. In a passage shown by the arrow 81, the current flows from the upper electrode layer 54 to the lower electrode layer 70 through the contact plugs 52, the anode region 30, the barrier region 32, the drift region 34, and the cathode region 36. In a passage shown by the arrow 82, the current flows from the upper electrode layer 54 in the contact holes 60 to the lower electrode layer 70 through the anode region 30, the barrier region 32, the drift region 34, and the cathode region 36. Holes flow into the drift region 34 from the anode region 30 in a state where the pn junction 31 is turned on.

As described above, in the operation upon the forward voltage application, the voltage is made less likely to be applied to the pn junction 31 by the electrons flowing in the interfaces 37 at a stage where the forward voltage is still low. Due to this, a timing at which the pn junction 31 turns on can be delayed, and holes are suppressed from flowing into the drift region 34 from the anode region 30.

Next, an operation upon the reverse voltage application will be described. When the applied voltage is switched from the forward voltage to the reverse voltage, the holes that were present in the drift region 34 during the forward voltage application are discharged to the upper electrode layer 54 through the barrier region 32 and the anode region 30. Due to this, a reverse current (so-called reverse recovery current) flows instantaneously in the diode. However, in this diode, since the inflow of the holes to the drift region 34 during the forward voltage application is suppressed as described above, the holes discharged to the upper electrode layer 54 upon the reverse voltage application are small in amount. Thus, the reverse recovery current is suppressed. Due to this, in this semiconductor device, a loss upon the reverse recovery operation of the diode is small. Further, in a state where the reverse voltage is applied constantly, a voltage is indeed applied to the pn junction 31, however hardly any current flows in the pn junction 31 due to the barrier of the pn junction 31. Further, in this state, a voltage is also applied to the interfaces 37 of the pillar regions 38 and the upper electrode layer 54. Here, in the interface 37, since the high barrier (Schottky barrier) is present against the current in the direction from the pillar regions 38 toward the upper electrode layer 54, hardly any current flows in the interfaces 37 as well. As above, in this semiconductor device, leak current is made less likely to flow in the diode in the state where the reverse voltage is applied constantly.

When the IGBTs and the diodes are operated, the semiconductor device 10 repeats a temperature increase and a temperature drop. Due to this, thermal stress is repeatedly generated in the semiconductor device 10. Here, the end 56a of the protective insulating film 56 is an interface with a region where the upper electrode layer 54 is covered by the protective insulating film 56 and a region where it is not. Due to this, a stress distribution in the upper electrode layer 54 at a portion immediately below the end 56a is easily disturbed locally, and a high thermal stress tends to occur at this portion during the temperature change. Especially in the end 56a, due to the protective insulating film 56, the upper electrode layer 54, and the front surface electrode layer 58 having different linear expansion coefficients being in contact with each other, a higher thermal stress tends to occur. That is, the upper electrode layer 54 at the portion immediately below the end 56a is more likely to experience higher thermal stress than any other portions of the upper electrode layer 54. If deep recesses are provided on the upper surface of the upper electrode layer 54 in this portion, even a higher thermal stress is generated at such a position, and there may be a case where a crack is generated in the upper electrode layer 54. However, in the semiconductor device 10 of the present embodiment, since the contact holes 62 are filled with the contact plugs 52, the upper surface of the upper electrode layer 54 above the contact holes 62 is made substantially flat. A deep recess such as the recesses 54a is not provided on the upper surface of the upper electrode layer 54 at the aforementioned portions. Accordingly, the generation of an extremely high thermal stress in the upper electrode layer 54 immediately below the end 56a is suppressed, and the generation of the crack in the upper electrode layer 54 at this portion can be suppressed.

Further, the deep recesses 54a are provided on the upper surface of the upper electrode layer 54 above the contact holes 60. However, since the end 56a of the protective insulating film 56 is not located above the recesses 54a, so no high thermal stress is generated in the upper electrode layer 54 in the vicinities of the recesses 54a. Accordingly, a generation of a crack is suppressed in the upper electrode layer 54 in the vicinities of the recesses 54a.

Next, a manufacturing method of the semiconductor device 10 will be described. The semiconductor device 10 is made of an n-type silicon substrate (that is, the silicon substrate 12 that has not been processed yet) having the same n-type impurity concentration as the drift region 34 over its entirety.

Figure 10:
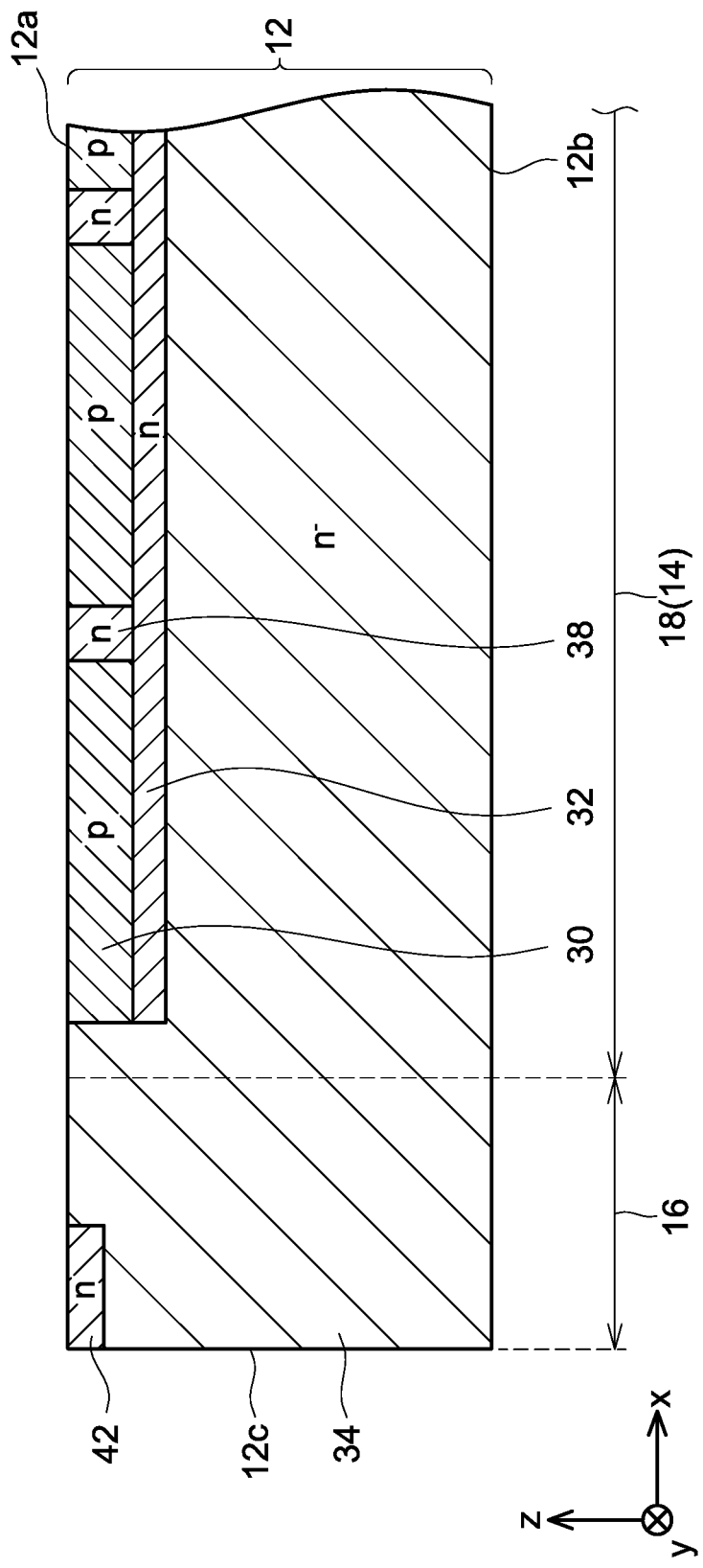
FIG. 10 is an explanatory diagram of a manufacturing process of the semiconductor device 10 (cross sectional view corresponding to FIG. 6)

Firstly, as shown in FIG. 10, the anode regions 30, the barrier regions 32, the pillar regions 38, and the outer circumferential n-type region 42 are formed by ion implantation. Further, although not shown, the emitter regions 44 are also formed in the IGBT field 17. Then, the trenches 20, the trench insulating films 22, and the trench electrodes 24 are formed. They can be formed by a conventionally known method, and these may be formed in any order.

Figure 11:
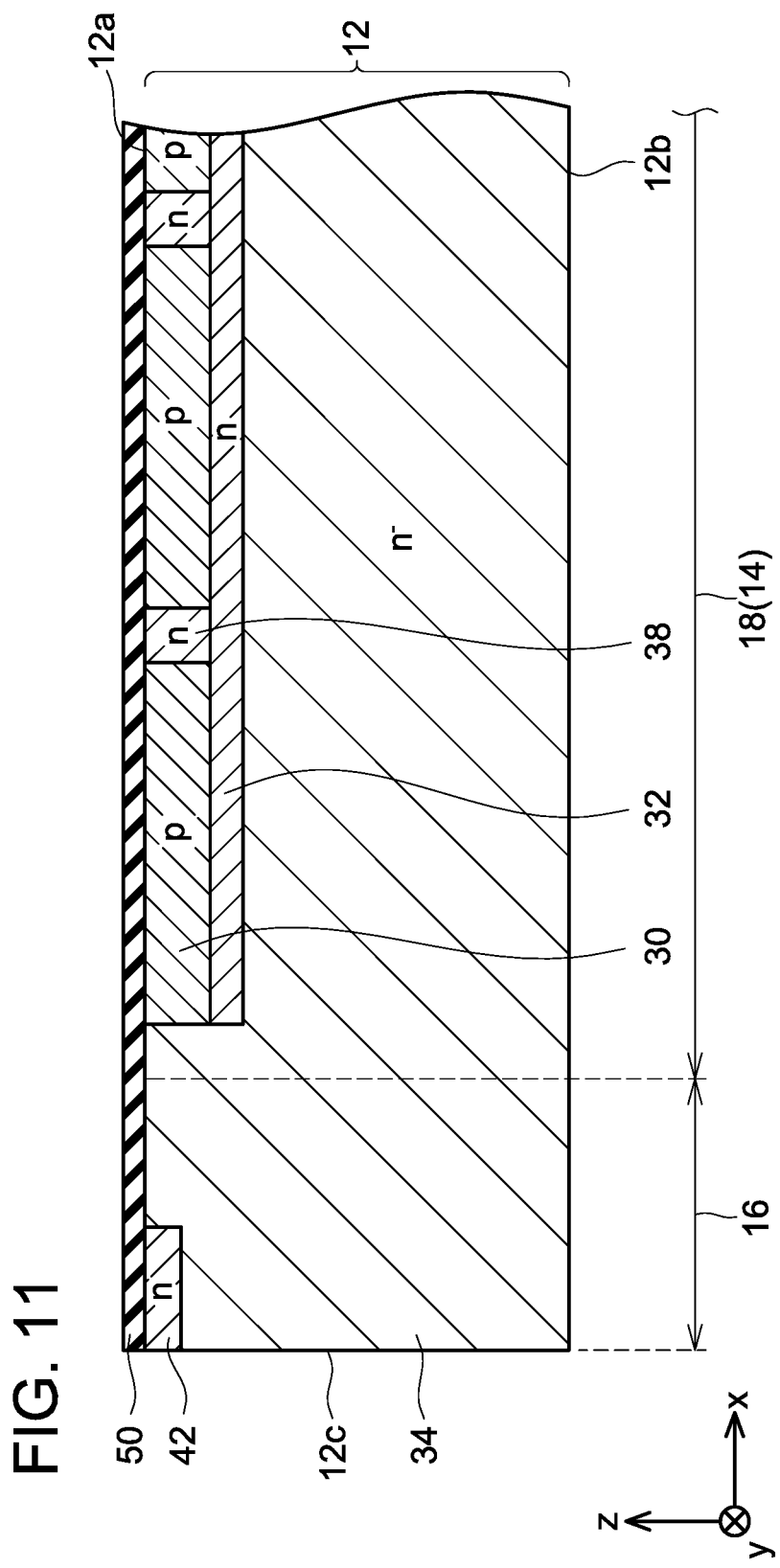
FIG. 11 is an explanatory diagram of the manufacturing process of the semiconductor device 10 (cross sectional view corresponding to FIG. 6)
Figure 12:
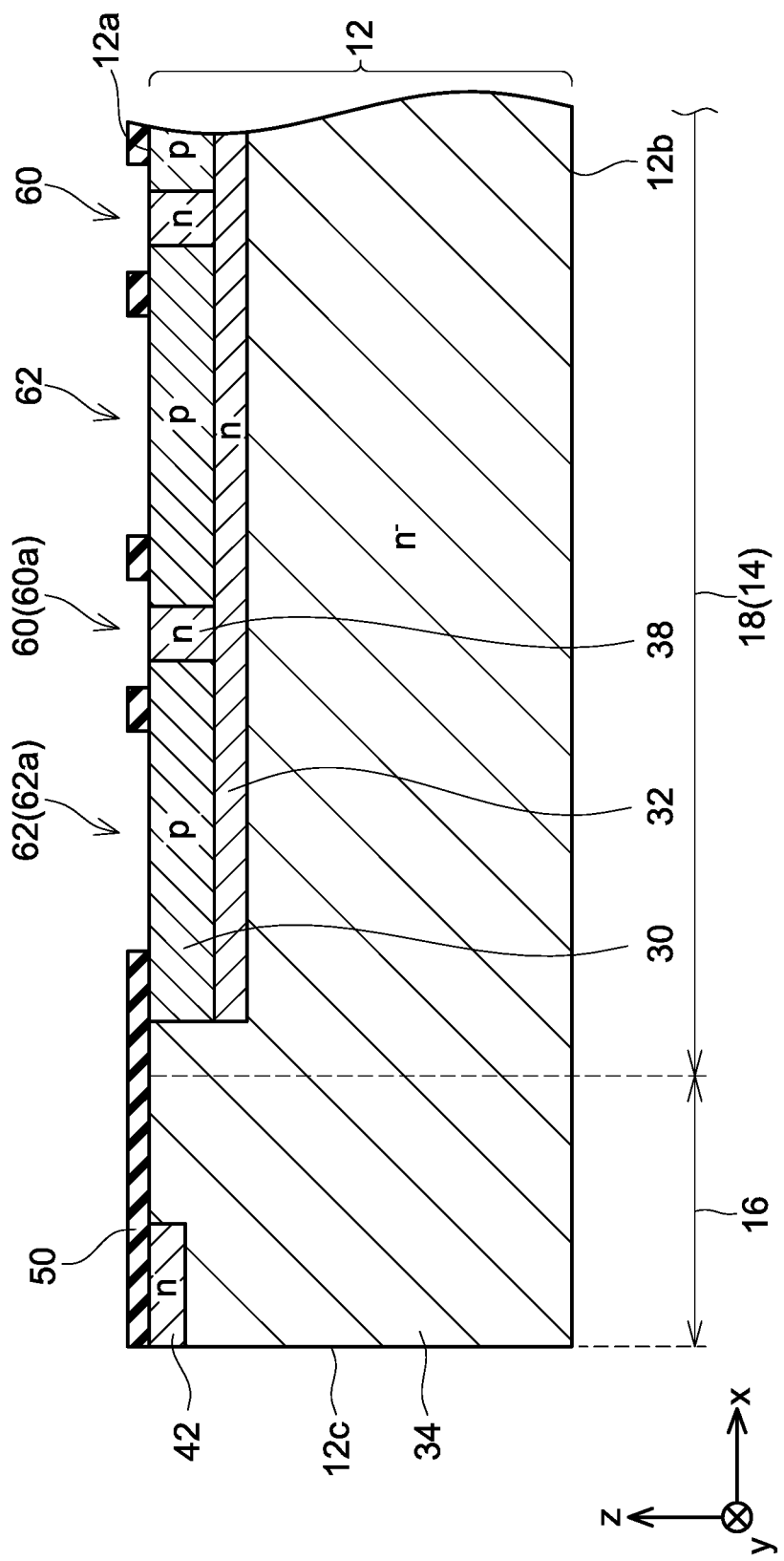
FIG. 12 is an explanatory diagram of the manufacturing process of the semiconductor device 10 (cross sectional view corresponding to FIG. 6)

Next, as shown in FIG. 11, the interlayer insulating film 50 is formed on the upper surface 12a of the silicon substrate 12. Notably, although not shown, the interlayer insulating film 50 is formed so as to cover not only the upper surface 12a of the silicon substrate 12 but also the upper surfaces of the trench electrodes 24. Next, as shown in FIG. 12, the contact holes 60 and the contact holes 62 are formed on the interlayer insulating film 50 by partially etching the interlayer insulating film 50. Here, the contact holes 62 are formed so that the anode region 30 is exposed but the pillar regions 38 are not exposed at bottom surfaces of the contact holes 62. Further, the contact holes 60 are formed so that the pillar region 38 and the anode region 30 are exposed at bottom surfaces of the contact holes 60. They are formed so that a width of the contact holes 62 becomes narrower than a width of the contact holes 60. Further, in each of the inter-trench ranges, the contact hole 62a closest to the external field 16 is arranged at the position closer to the external field 16 than the contact hole 60a closest to the external field 16.

Next, a barrier metal 52a is thinly formed on an entirety of an upper surface of the substrate by sputtering. That is, the Ti layer and the TiN layer configuring the barrier metal 52a are grown on the upper surface of the substrate in this order. Since a thickness of the barrier metal 52a is thin, the barrier metal 52a is grown suitably on the inner surfaces of the contact holes 62 with the narrow width. The barrier metal 52a makes contact with the anode region 30 with a low resistance (that is, in ohmic connection).

Figure 13:
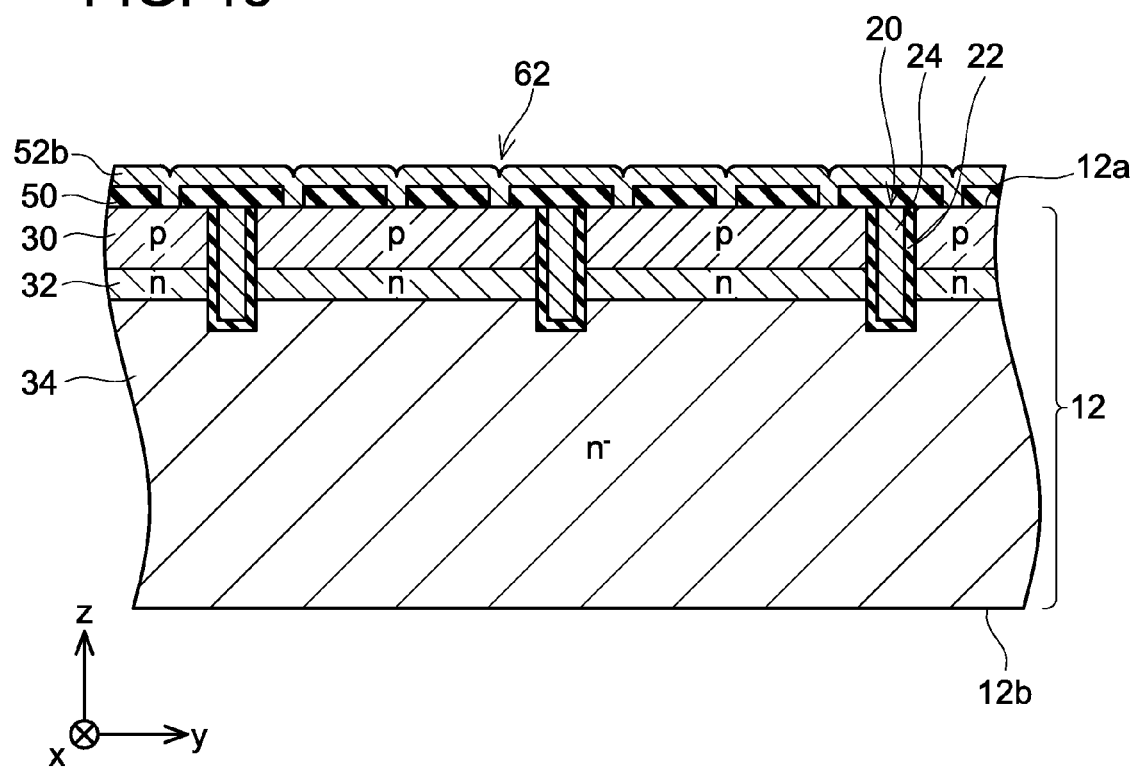
FIG. 13 is an explanatory diagram of the manufacturing process of the semiconductor device 10 (cross sectional view corresponding to FIG. 4)
Figure 14:
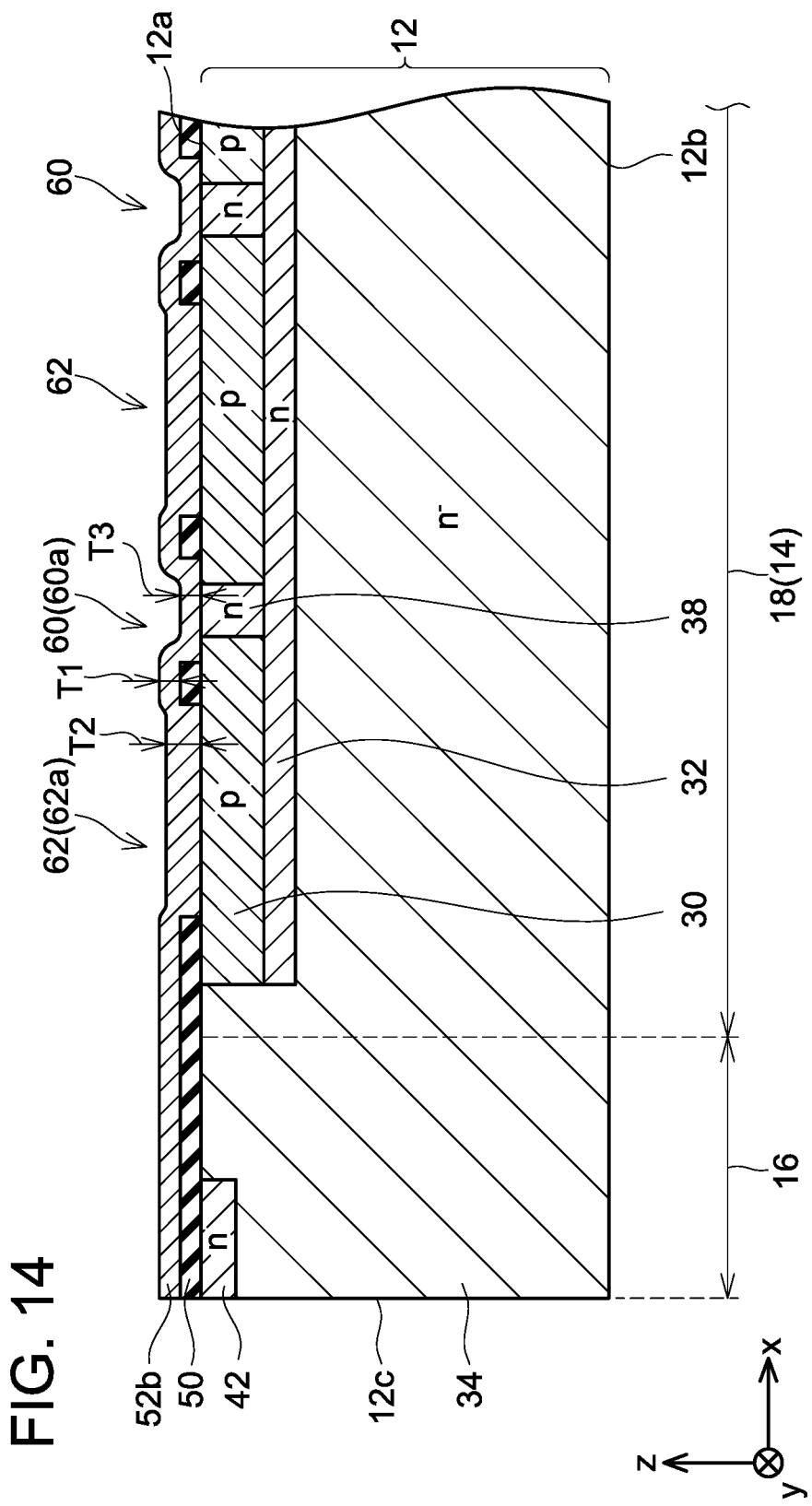
FIG. 14 is an explanatory diagram of the manufacturing process of the semiconductor device 10 (cross sectional view corresponding to FIG. 6)

Thereafter, as shown in FIGS. 13 and 14, a fill-metal layer 52b is deposited on the barrier metals 52a (omitted in FIGS. 13 and 14) by CVD. Here, the fill-metal layer 52b is deposited so that a film thickness becomes thicker than half ($\frac{1}{2}$) the width of the contact holes 62 and thinner than half ($\frac{1}{2}$) the width of the contact hole 60. The fill-metal layer 52b is grown on the inner surfaces of the contact holes 60, the inner surfaces of the contact holes 62, and the upper surface of the interlayer insulating film 50.

In each of the contact holes 62, the fill-metal layer 52b is grown on a bottom surface and both side surfaces of the contact hole 62. Since the fill-metal layer 52b is grown to be thicker than half ($\frac{1}{2}$) the width of the contact holes 62, the fill-metal layer 52b grown on both side surfaces of each contact hole 62 is connected at a center portion of the contact hole 62. Due to this, the fill-metal layer 52b is grown in the contact holes 62 without any gap. Accordingly, a thickness T2 of the fill-metal layer 52b on the bottom surfaces of the contact holes 62 becomes thicker than a thickness T1 of the fill-metal layer 52b above the interlayer insulating film 50. By using the CVD, the fill-metal layer 52b can tightly be grown within the contact holes 62 having the narrow width. Accordingly, the formation of gaps in the contact holes 62 is suppressed.

On the other hand, in each of the contact holes 60, the fill-metal layer 52b is grown on a bottom surface and both side surfaces of the contact hole 60. Since the fill-metal layer 52b is grown to be thinner than half ($\frac{1}{2}$) the width of the contact holes 60, the fill-metal layer 52b grown on both side surfaces of each contact hole 60 is not connected to one another. Accordingly, in the contact holes 60, the fill-metal layer 52b is grown at a uniform thickness along the inner surfaces of the contact holes 60. Accordingly, a thickness T3 of the fill-metal layer 52b on the bottom surfaces of the contact holes 60 becomes substantially equal to the thickness T1 of the fill-metal layer 52b above the interlayer insulating film 50. Due to this, the thickness T3 of the fill-metal layer 52b on the bottom surfaces of the contact holes 60 becomes thinner than the thickness T2 of the fill-metal layer 52b on the bottom surfaces of the contact holes 62.

Notably, upon forming the fill-metal layer 52b, a metal element (that is, tungsten) configuring the fill-metal layer 52b is prevented from diffusing into the silicon substrate 12 by the barrier metal 52a. Due to this, formation of defects and the like at contact portions of the silicon substrate 12 can be prevented.

Figure 15:
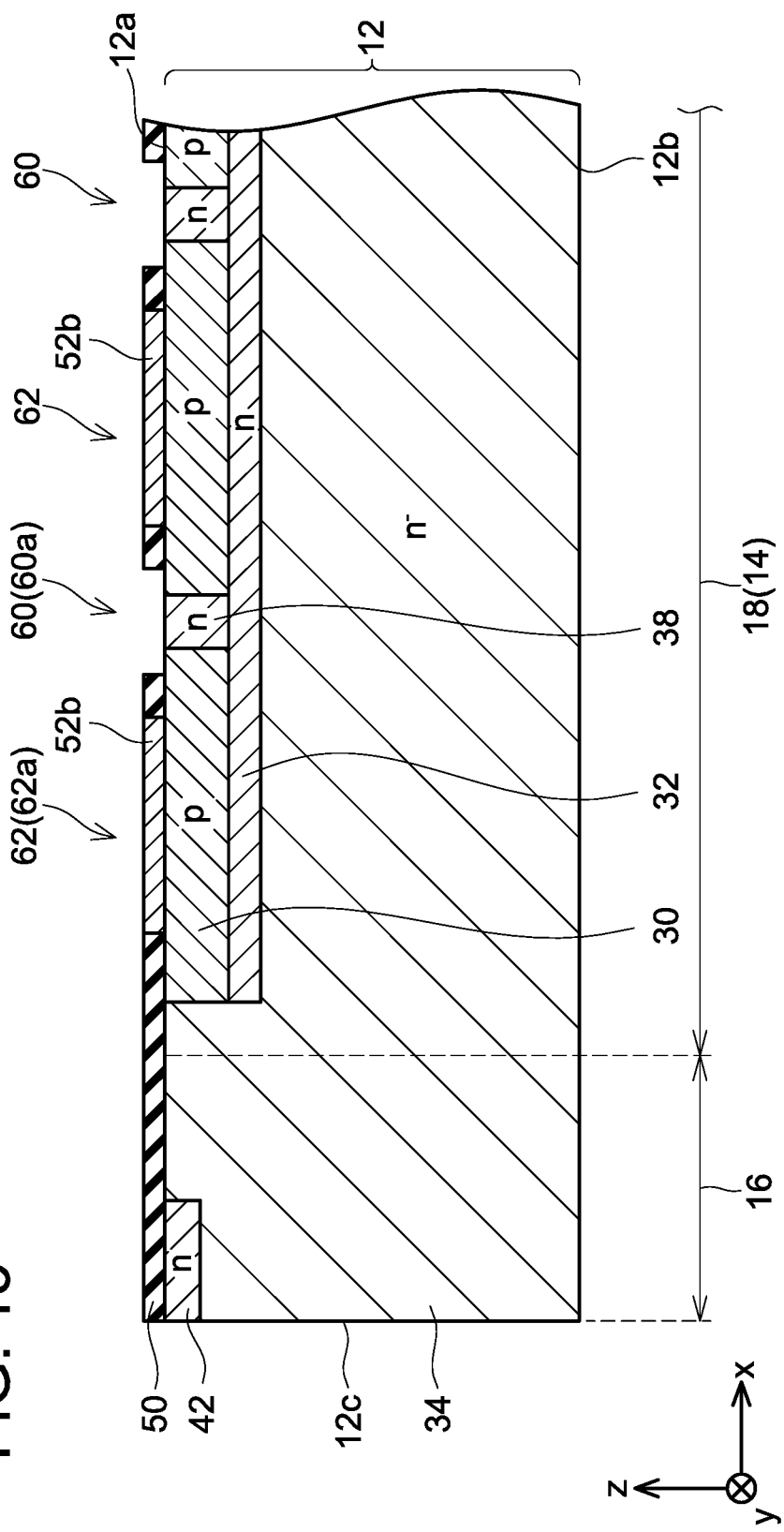
FIG. 15 is an explanatory diagram of the manufacturing process of the semiconductor device 10 (cross sectional view corresponding to FIG. 6)

Next, as shown in FIG. 15, the fill-metal layer 52b is etched. Here, the fill-metal layer 52b above the interlayer insulating film 50 is removed, and the fill-metal layer 52b is caused to remain in the contact holes 62. More specifically, the etching is performed so that upper surfaces of the fill-metal layers 52b remaining in the contact holes 62 come to substantially match the upper surface of the interlayer insulating film 50. Further, the fill-metal layer 52b in the contact holes 60 is also etched. As described above, the thickness T3 of the fill-metal layer 52b in the contact holes 60 is substantially equal to the thickness T1 of the fill-metal layer 52b above the interlayer insulating film 50. Accordingly, the fill-metal layer 52b in the contact holes 60 is also removed. In regions where the fill-metal layer 52b in the contact holes 60 has been removed, the barrier metal 52a is exposed. Then, the barrier metal 52a in the exposed ranges is removed by etching. Due to this, the silicon substrate 12 is exposed at the bottom surfaces of the contact holes 60. Further, the upper surface of the interlayer insulating film 50 is exposed. The fill-metal layers 52b and the barrier metals 52a remaining in the contact holes 62 are the contact plugs 52.

Figure 16:
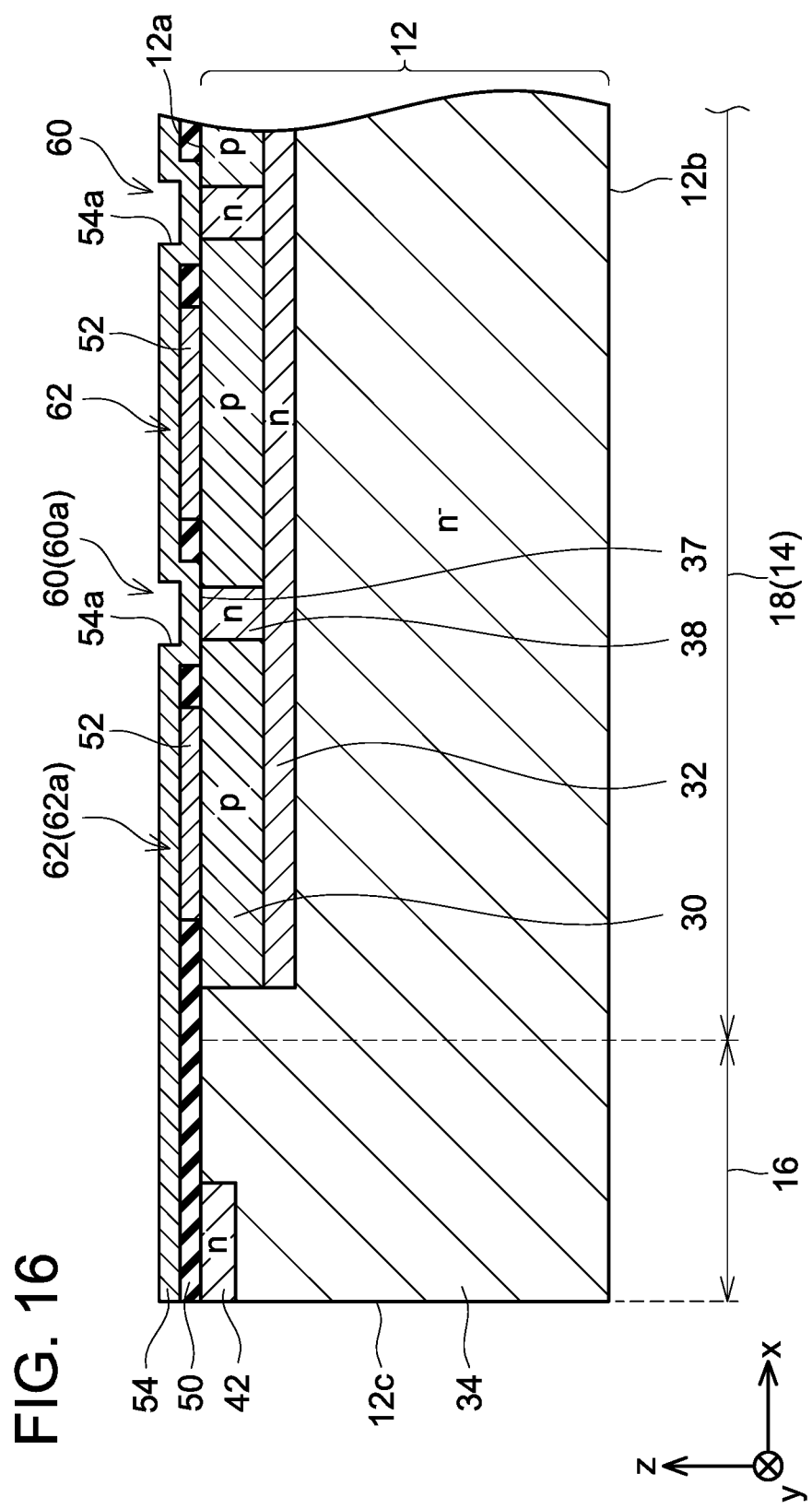
FIG. 16 is an explanatory diagram of the manufacturing process of the semiconductor device 10 (cross sectional view corresponding to FIG. 6)

Next, as shown in FIG. 16, the upper electrode layer 54 is grown on the upper surface of the substrate by sputtering. That is, the upper electrode layer 54 is grown on the upper surface of the interlayer insulating film 50, the upper surfaces of the contact plugs 52, and the inner surfaces of the contact holes 60. Notably, if the thickness of the upper electrode layer 54 (that is, AlSi) is thin, the Al in the upper electrode layer 54 and Si in the silicon substrate 12 diffuse mutually at the interface between the upper electrode layer 54 and the silicon substrate 12. When heat is generated in a post-process or during use of the semiconductor device 10, this mutual diffusion progresses, and a phenomenon in which Al extends into the silicon substrate 12 in a wedge shape (generally called Al spikes) is generated, and performance of the semiconductor device 10 is thereby deteriorated. If the thickness of the upper electrode layer 54 is thick, the aforementioned mutual diffusion is suppressed, and the Al spikes can be prevented. Here, the upper electrode layer 54 is grown thick enough to suppress the generation of the Al spikes. Here, the upper electrode layer 54 is grown much thicker than the barrier metals 52a. Since the width of the contact holes 60 is wide, no gap will be generated in the contact holes 60 even if the upper electrode layer 54 is grown thick in the contact holes 60. A thick upper electrode layer 54 can be formed in the contact holes 60. A high barrier is generated in the interfaces 37 of the upper electrode layer 54 in the contact holes 60 and the pillar regions 38. That is, the upper electrode layer 54 makes a Schottky contact with the pillar regions 38. Further, the upper electrode layer 54 in the contact holes 60 also makes contact with the anode regions 30. The upper electrode layer 54 makes ohmic contact with the p-type anode regions 30. Further, due to the width of the contact holes 60 being wide, the recesses 54a are formed on the upper surface of the upper electrode layer 54 following the shapes of the contact holes 60.

Figure 17:
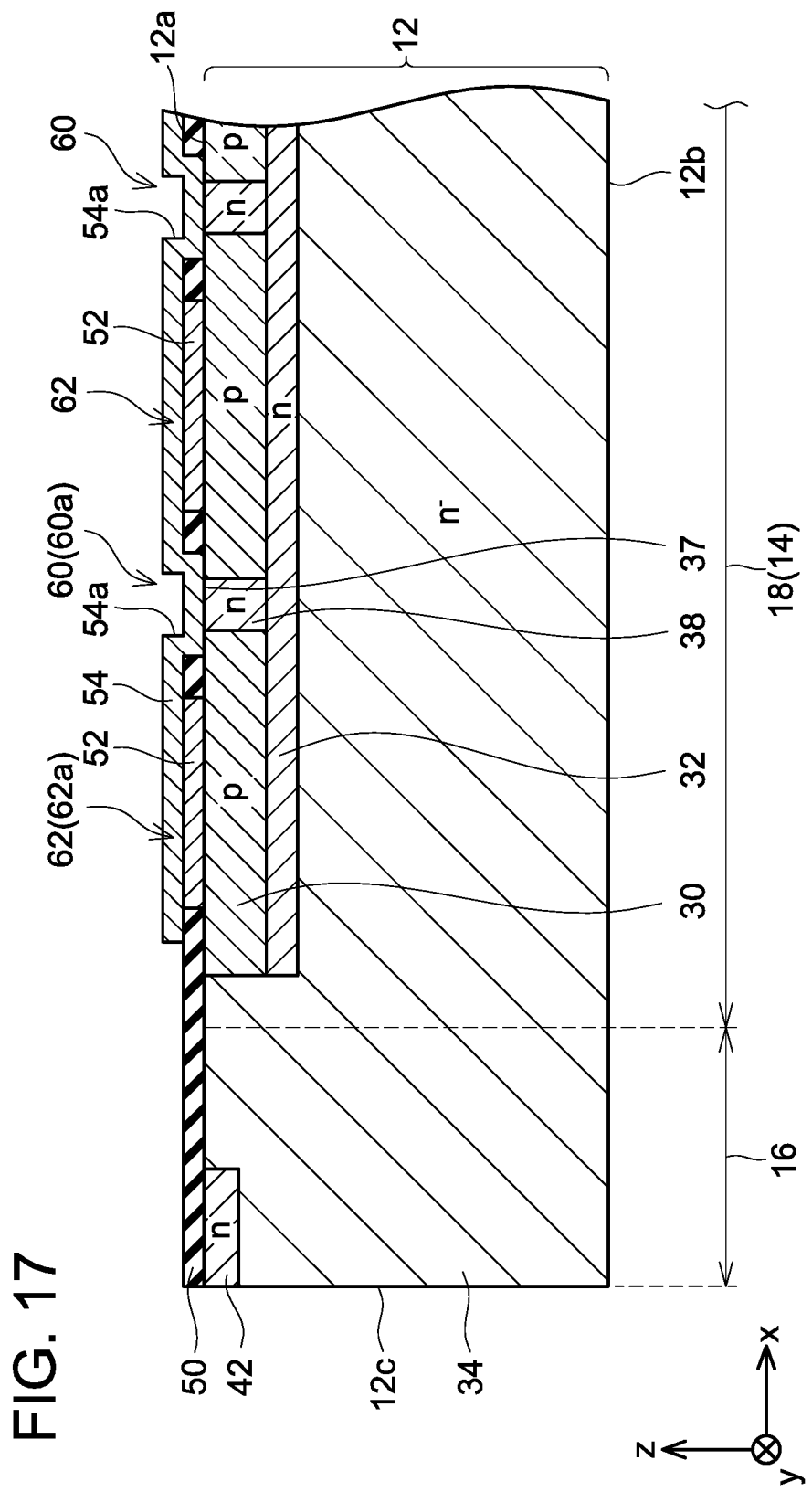
FIG. 17 is an explanatory diagram of the manufacturing process of the semiconductor device 10 (cross sectional view corresponding to FIG. 6)

Next, as shown in FIG. 17, an unnecessary portion of the upper electrode layer 54 (for example, the upper electrode layer 54 in the external field 16) is removed by selectively etching the upper electrode layer 54.

Figure 18:
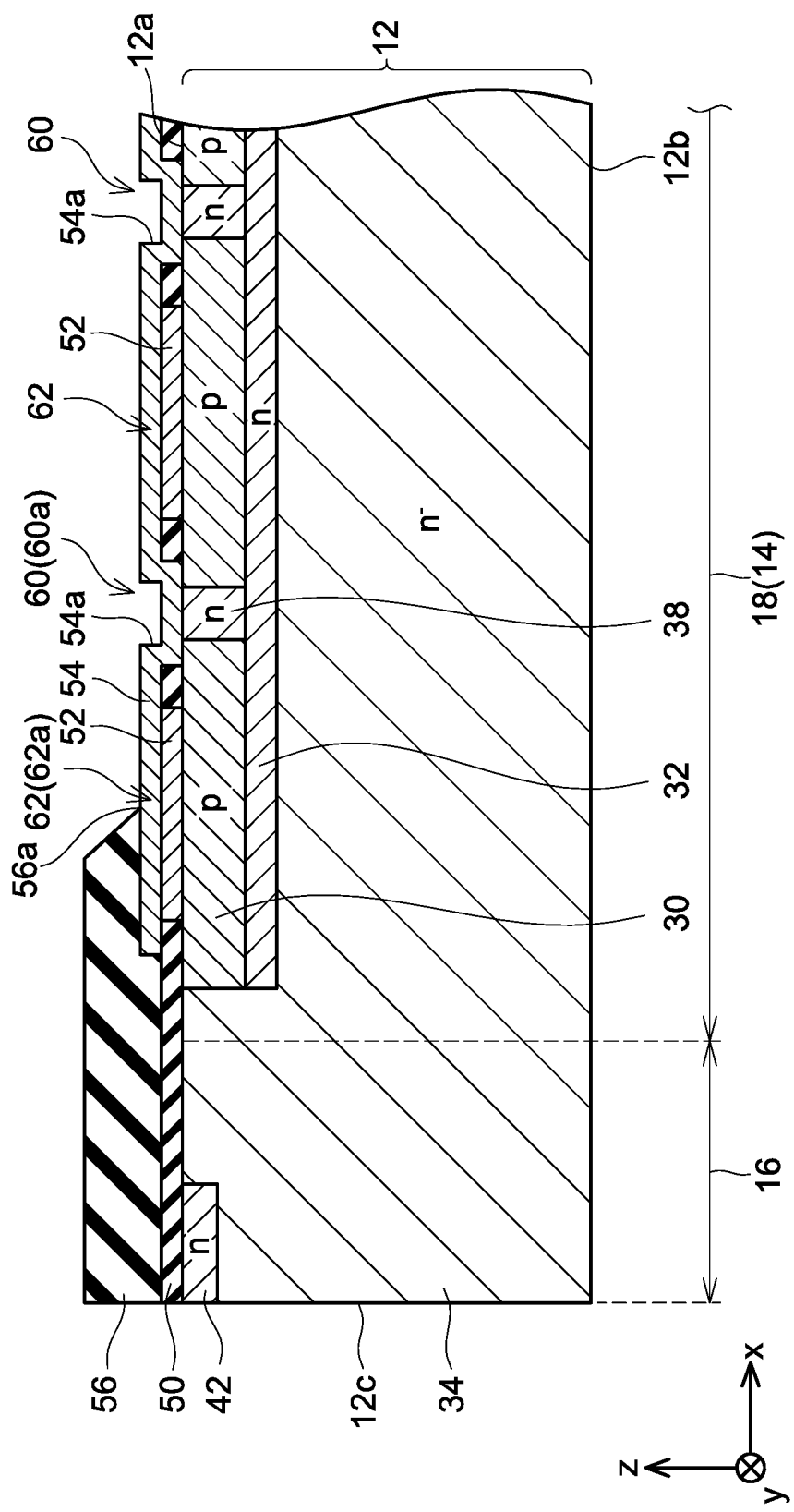
FIG. 18 is an explanatory diagram of the manufacturing process of the semiconductor device 10 (cross sectional view corresponding to FIG. 6)

Then, as shown in FIG. 18, the protective insulating film 56 is formed. More specifically, the protective insulating film 56 is formed over an entirety of the front surface of the substrate, and thereafter the protective insulating film 56 at a center portion of the element field 14 is removed by etching. The protective insulating film 56 is caused to remain on an outer circumferential portion (portion close to the external field 16) of the element field 14. Due to this, the structure in which the upper surface of the external field 16 and the upper electrode layer 54 in the vicinity thereof are covered by the protective insulating film 56 as shown in FIG. 18 is obtained. Here, the end 56a of the protective insulating film 56 extending in the y direction is arranged to pass above the contact holes 62a at the positions closest to the external field 16.

Figure 19:
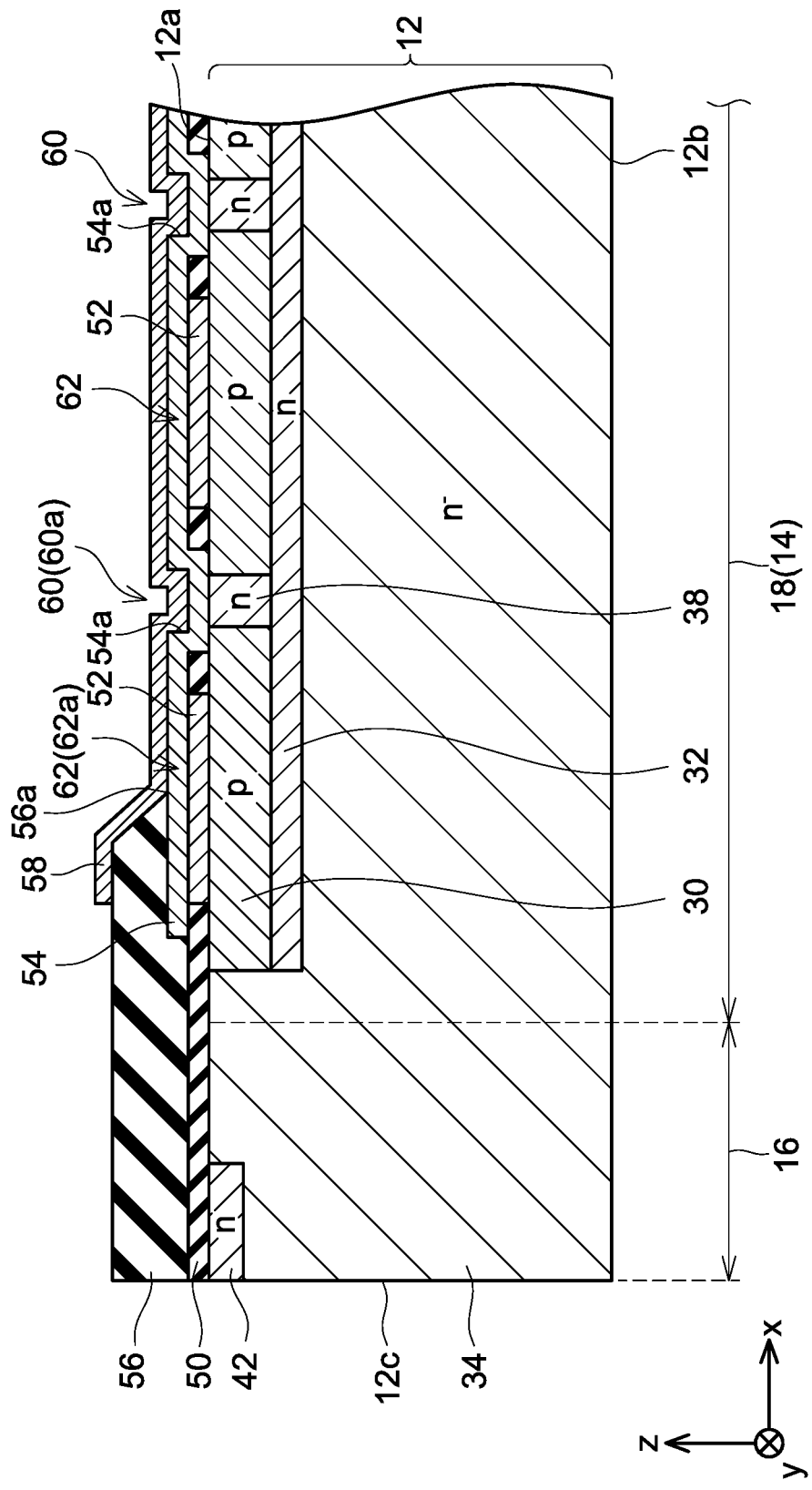
FIG. 19 is an explanatory diagram of the manufacturing process of the semiconductor device 10 (cross sectional view corresponding to FIG. 6)

Then, as shown in FIG. 19, the front surface electrode layer 58 is formed. More specifically, the front surface electrode layer 58 is formed over the entirety of the front surface of the substrate, and thereafter an unnecessary portion of the front surface electrode layer 58 (for example, the front surface electrode layer 58 in the external field 16) is removed by etching the front surface electrode layer 58. Notably, the remaining front surface electrode layer 58 is configured to cover the end 56a of the protective insulating film 56. When the front surface electrode layer 58 on the protective insulating film 56 is entirely removed, there may be a case where a thickness of the front surface electrode layer 58 on the upper electrode layer 54 becomes thin in the vicinity of the end 56a of the protective insulating film 56. With respect to this, as in the present embodiment, the entirety of the upper electrode layer 54 can be covered by the front surface electrode layer 58 having the substantially uniform thickness by causing the front surface electrode layer 58 to remain such that the part of the front surface electrode layer 58 covers the protective insulating film 56.

The processes on the upper surface 12a side is completed by the above processes. Thereafter the processes on the lower surface 12b side are performed (that is, the formation of the cathode region 36, the formation of the collector region 46, and the formation of the lower electrode layer 70), and the semiconductor device 10 is thereby completed.

As described above, in the present embodiment, the contact holes 62 having the narrow width are formed in the portions where the upper electrode layer 54 needs to be connected to the silicon substrate 12 with a low resistance. Further, the contact holes 62 are filled with the contact plugs 52. Since the barrier metals 52a have a thin thickness, they can suitably be formed in the contact holes 62 having the narrow width. Further, since the fill-metal layers 52b are deposited by CVD, they can suitably be formed in the contact holes 62 having the narrow width. Accordingly, the contact holes 62 can suitably be filled by the contact plugs 52. Thus, the upper surface of the upper electrode layer 54 above the contact holes 62 can be flattened. Accordingly, by arranging the end 56a of the protective insulating film 56 above the contact holes 62 (that is, on the flat upper electrode layer 54), the thermal stress in the upper electrode layer 54 immediately below the end 56a can be alleviated. Due to this, the cracking in the upper electrode layer 54 immediately below the end 56a can be suppressed.

Further, in the present embodiment, the contact holes 60 having the wide width are formed at the portions where the upper electrode layer 54 needs to make Schottky contact with the pillar regions 38, and the upper electrode layer 54 is provided thickly within the contact holes 60. By employing the contact holes 60 having the wide width, gaps are suppressed from being formed within the contact holes 60 (that is, inside the upper electrode layer 54) even if the upper electrode layer 54 is formed thickly within the contact holes 60. Moreover, by forming the upper electrode layer 54 thick as aforementioned, the Al spikes can be prevented. Further, when the upper electrode layer 54 is formed as aforementioned, the recesses 54a are formed on the upper surface of the upper electrode layer 54 following the shapes of the contact holes 60. However, since the end 56a of the protective insulating film 56 is not located above the recesses 54a, the generation of high thermal stress in the upper electrode 54 in the vicinity of the recesses 54a can be suppressed. Due to this, the cracking in the upper electrode layer 54 in the vicinities of the recesses 54a can be suppressed.

Further, in this manufacturing method, when the fill-metal layer 52b is deposited, the fill-metal layer 52h is deposited with the film thickness thicker than half (½) the width of the contact holes 62 and thinner than half (½) the width of the contact hole 60. Accordingly, by simply etching the fill-metal layer 52b thereafter, the fill-metal layers 52b can be caused to remain within the contact holes 62 and the fill-metal layer 52b can be removed from within the contact holes 60. The fill-metal layers 52b can be caused to remain within the contact holes 62 and the fill-metal layer 52b can be removed from within the contact holes 60 without performing masking or the like on the fill-metal layer 52b. Thus, according to this method, the semiconductor device 10 can be manufactured efficiently.

Notably, in the aforementioned embodiment, the fill-metal layers 52b and the barrier metals 52a are completely removed from within the contact holes 60, however, the fill-metal layers 52b and the barrier metals 52a may partially remain in the contact holes 60. That is, so long as the upper electrode layer 54 can make contact with the pillar regions 38 in the contact holes 60, the fill-metal layers 52b and the barrier metals 52a may remain in the contact holes 60.

Notably, in the aforementioned embodiment, the ohmic contact means that the barrier in the direction along which the current flows from the semiconductor toward the metal is substantially equal to the barrier in the opposite direction thereof. Further, the Schottky contact means that the barrier in the direction along which the current flows from the semiconductor toward the metal is larger than the barrier in the opposite direction thereof. Whether the semiconductor and the metal makes ohmic contact or Schottky contact depends on a work function of the metal, an impurity concentration of the semiconductor, and the like. By appropriately setting the work function of the metal relative to the semiconductor, the ohmic contact and the Schottky contact can be formed selectively. Further, by making the impurity concentration of the semiconductor high, the depletion layer (barrier portion) formed in the interface between the metal and the semiconductor can be thinned off. As above, when the depletion layer is thinned off, carriers flow by tunneling through the depletion layer. In this case, the ohmic contact can be obtained regardless of the work function of the metal.

Further, in the aforementioned embodiment, the upper electrode layer 54 making Schottky contact with the pillar regions 38 is configured of AlSi. However, the upper electrode layer 54 may be configured of a metal having the work function in a range of 4.25 to 5.05 eV (for example, Ni or the like).

Further, in the aforementioned embodiment, the barrier metals 52a at the portions making contact with the silicon substrate 12 is configured of Ti. However, the barrier metals 52a at these portions may be configured of a metal that is ohmic contactable to the anode region 30 (for example, Co or the like). The metal that makes ohmic contact with the anode region 30 preferably has the work function that is less than 4.25 eV, and more preferably less than 4.05 eV. Further, even if the work function of this metal is higher than 4.25 eV, the ohmic contact by the tunneling can be obtained by making the p-type impurity concentration of the contact portions of the anode region 30 to be high.

Further, in the aforementioned embodiment, the fill-metal layers 52b are configured of W. However, the fill-metal layers 52b may be configured of another metal that can be deposited by CVD (fir example, copper or the like).

Further, in the aforementioned embodiment, the IGBT fields 17 and the diode fields 18 are partitioned. However, a structure in which IGBTs and diodes are coexistent may be employed. For example, the emitter region 44 may be formed in all of the inter-trench ranges. Even in such a structure, the anode region 30, the barrier region 32, the pillar regions 38, the drift region 34, and the cathode region 36 can function as a diode similar to the above embodiment.

Figure 20:
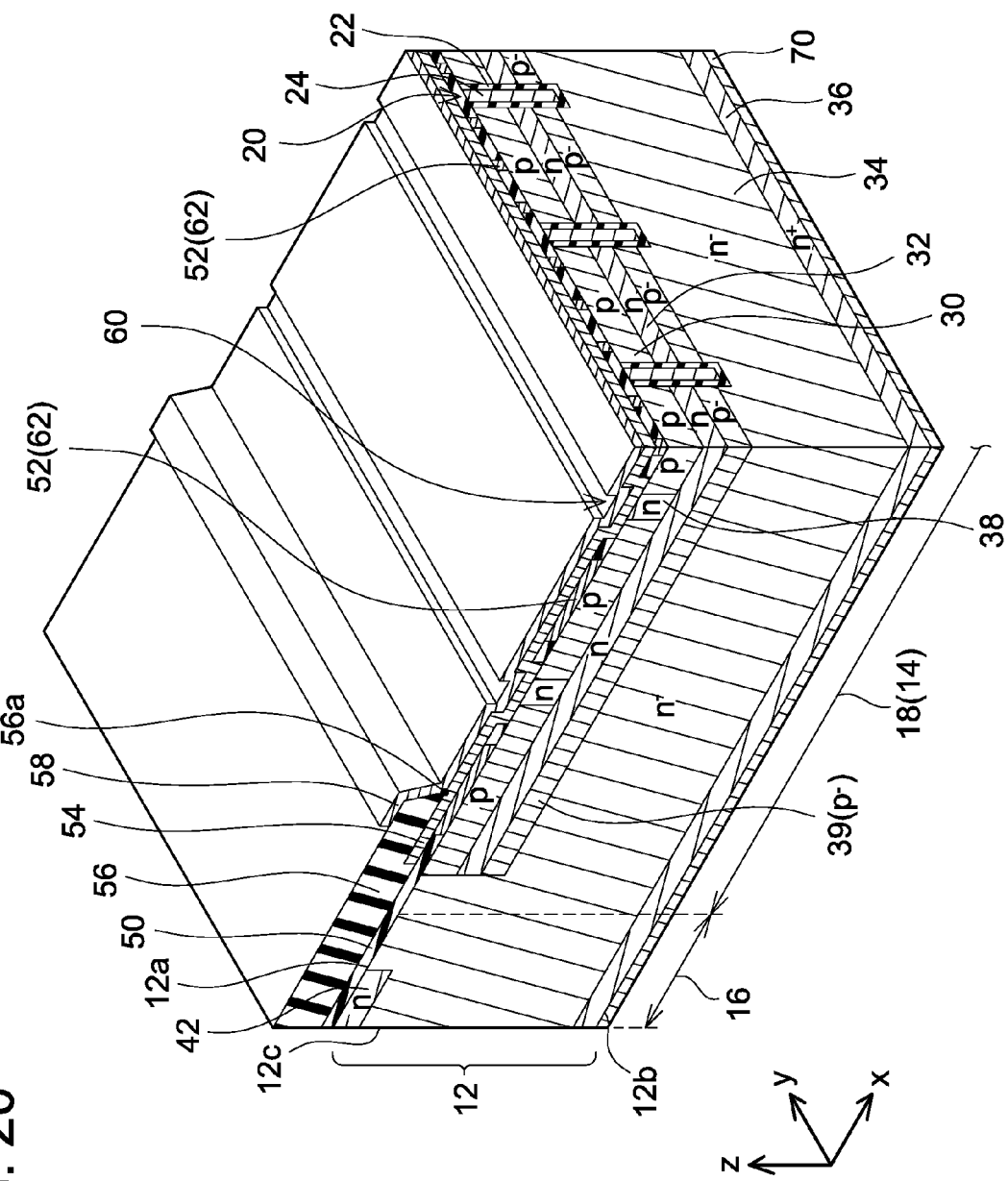
FIG. 20 is a cross sectional perspective view of a semiconductor device of a variant.

Further, in the aforementioned embodiment, the drift region 34 makes direct contact with the barrier regions 32. However, as shown in FIG. 20, a p-type regions 39 may be provided between the drift region 34 and the barrier regions 32. Even in this structure, if a p-type impurity concentration of the p-type regions 39 is low, the diode and the IGBT can function similar to the aforementioned embodiment.

Further, in the semiconductor device 10 of the aforementioned embodiment, the diodes and the IGBTs are provided, however, diodes and MOSFETs may be provided. A MOSFET can be configured by replacing the collector region 46 in the aforementioned embodiment to an n-type region.

Further, the semiconductor device 10 of the aforementioned embodiment is provided with the front surface electrode layer 58, however, the front surface electrode layer 58 may not be provided. Even in such a configuration, a high stress may be generated in the upper electrode layer 54 below the end 56a of the protective insulating film 56. Thus, the cracking of the upper electrode layer 54 under the end 56a can be suppressed by arranging the end 56a above the contact holes 62.

Further, in the aforementioned embodiment, the contact holes 60a, 62a, the anode region 30, the barrier region 32, and the pillar regions 38 are provided in all of the inter-trench ranges. That is, in the aforementioned embodiment, all of the inter-trench ranges correspond to specific inter-trench ranges. However, an inter-trench region where at least one or more of the aforementioned are not provided may be present. That is, one or more of the inter-trench ranges may not be a specific inter-trench range.

Explanation will be given on constituent features of the aforementioned embodiment and the constituent features of the claims. The contact holes 60a of the embodiment are an example of first contact holes of the claims. The contact holes 62a of the embodiment are an example of second contact holes of the claims. The barrier metals 52a of the embodiment are an example of first metal layers of the claims. The fill-metal layers 52b of the embodiment are an example of second metal layers (material layer) of the claims.

Preferred configurations of the aforementioned embodiment will be listed below. Notably, each of the configurations listed below is useful on its own.

In one example of the configuration disclosed herein, the semiconductor device may comprise a surface electrode layer covering an upper surface of the upper electrode layer in a range not covered by the protective insulating film. The surface electrode layer may further cover a part of the protective insulating film and be configured of a metal different in kind from the upper electrode layer.

The front surface electrode layer is provided for a purpose of protecting the upper electrode layer or for a purpose of improving connectivity to the upper electrode layer (for example, wettability to solder and the like). In this configuration, the three layers, namely the upper electrode layer, the protective insulating film, and the front surface electrode layer make contact with each other at an end of the protecting insulating film. As above, when three different types of materials come into contact at the end of the protecting insulating film, higher stress is likely to occur in the vicinity of the end of the protecting insulating film due to differences in the linear expansion coefficients of the three layers. That is, in such a configuration, the necessity to alleviate the stress in the upper electrode layer under the end of the protecting insulating film is higher. Thus, the stress can suitably be alleviated by arranging the end of the protecting insulating film on the upper electrode layer having the flat upper surface.

In one example of the configuration disclosed herein, the upper electrode layer in the first contact hole may be in contact with the anode region.

According to this configuration, the contact portion between the upper electrode layer and the anode electrode can serve as a current passage when the diode turns on. Thus, the loss generated in the diode can be suppressed.

In one example of the configuration disclosed herein, the formation of the second metal layer may comprise a first process and a second process. In the first process, a material layer of the second metal layers is deposited on the upper surface of the interlayer insulating film, the inner surfaces of the first contact holes, and the inner surfaces of the second contact holes. The material layer has a thickness greater than half of the width of the second contact hole and smaller than half of the width of the first contact hole. In the second process, the first metal layer and the material layer are etched so that an upper surface of the interlayer insulating film is exposed, bottom surfaces of the first contact holes are exposed, and the first metal layer and the second metal layer remain in a state in which the first metal layer and the second metal layer cover the bottom surface of the second contact hole.

In this configuration, since the film thickness of the material layer (the second metal layers) is thicker than half (½) the width of the second contact holes, the material layer deposited on both side surfaces of each second contact hole is connected at substantially the center portion of the second contact hole. Due to this, the second contact holes are filled by the material layer. As a result, a thickness (that is, a distance between a bottom surface of a second contact hole and an upper surface of the corresponding second metal layer) of the metal layers (first metal layer and second metal layer) covering the second contact hole becomes thicker than the thickness of the metal layer on the interlayer insulating film. On the other hand, since the film thickness of the material layers is thinner than half (½) the width of the first contact holes, the material layer is deposited with the substantially uniform thickness in each of the first contact holes. As a result, the thickness of the material layer in the first contact holes becomes substantially equal to the thickness of the material layer on the interlayer insulating film. That is, the thickness of the material layer covering the second contact holes becomes thicker than the thickness of the material layer covering the first contact holes. Thus, in the etching that is to take place thereafter, the bottom surfaces of the first contact holes can be exposed while the first metal layers and the second metal layers can be caused to remain in the state of covering the bottom surfaces of the second contact holes. According to this method, the first metal layers and the second metal layers can be caused to remain within the second contact holes easily, and the bottom surfaces of the first contact holes can be exposed. Notably, the bottom surfaces of the first contact holes does not need to be exposed over their entireties, and it will be sufficient if at least a part of them (the front surfaces of the pillar regions) is exposed.

The embodiments have been described in detail in the above. However, these are only examples and do not limit the claims. The technology described in the claims includes various modifications and changes of the concrete examples represented above. The technical elements explained in the present description or drawings exert technical utility independently or in combination of some of them, and the combination is not limited to one described in the claims as filed. Moreover, the technology exemplified in the present description or drawings achieves a plurality of objects at the same time, and has technical utility by achieving one of such objects.

What is claimed is:

1. A semiconductor device including a diode,
the semiconductor device comprising a silicon substrate, trench insulating films, trench electrodes, an interlayer insulating film, contact plugs, an upper electrode layer, a protective insulating film, and a lower electrode layer,
wherein
the silicon substrate is configured so that:
the silicon substrate comprises an element field and an external field, a plurality of trenches extending in a striped pattern being provided in an upper surface of the silicon substrate in the element field, and the external field being adjacent to the element field in a longitudinal direction of the trenches;
the silicon substrate comprises a plurality of inter-trench ranges, each of the inter-trench ranges being provided in each of positions between the two neighboring trenches in a plan view of the upper surface of the silicon substrate;
a plurality of specific inter-trench ranges is selected from among the plurality of the inter-trench ranges;
each of the specific inter-trench ranges comprises an anode region, a barrier region and a pillar region;
each of the anode regions is a p-type semiconductor region exposed on the upper surface of the silicon substrate;
each of the barrier regions is an n-type semiconductor region located under the anode region;
each of the pillar regions is an n-type semiconductor region extending from a position exposed on the upper surface of the silicon substrate to a position being in contact with the barrier region;
the silicon substrate comprises a drift region and a cathode region located on a lower side with respect to the barrier regions;
the drift region is located under the barrier regions, connected to the barrier regions directly or via a p-type semiconductor region, and having an impurity concentration lower than an impurity concentration of the barrier regions; and
the cathode region is an n-type semiconductor region located under the drift region, exposed on a lower surface of the silicon substrate, and having an impurity concentration higher than the impurity concentration of the drift region, each of the trench insulating films covers an inner surface of the corresponding trench, each of the trench electrodes is located in the corresponding trench of which inner surface is covered by the trench insulating film, the interlayer insulating film covers the upper surface of the silicon substrate in the element filed and upper surfaces of the trench electrodes, a first contact hole and a second contact hole penetrating the interlayer insulating film are provided in each of the specific inter-trench ranges, each of the second contact holes is located in a position closer to the external field than the corresponding first contact hole, each of the second contact holes has a width narrower than a width of the corresponding first contact hole, each of the contact plugs is located in the corresponding second contact hole, the contact plug comprises a first metal layer being in contact with the upper surface of the silicon substrate and a second metal layer located on the first metal layer, the upper electrode layer covers an upper surface of the interlayer insulating film, upper surfaces of the second metal layers, and inner surfaces of the first contact holes, the upper electrode layer has a thickness greater than a thickness of the first metal layers, the protective insulating film covers an upper surface of the external field and a part of the upper electrode layer, the protective insulating film comprises an end portion extending on the upper electrode layer through a range located above the plurality of the second contact holes along a direction intersecting with the plurality of trenches, the lower electrode layer covers the lower surface of the silicon substrate, each of the anode regions is in contact with the corresponding first metal layer by ohmic contact, the pillar regions are in contact with the upper electrode layer by Schottky contact and not in contact with the first metal layer, and the cathode region is in contact with the lower electrode layer.

2. The semiconductor device of claim 1, further comprising a surface electrode layer covering an upper surface of the upper electrode layer in a range not covered by the protective insulating film, the surface electrode layer further covering a part of the protective insulating film and configured of a metal different in kind from the upper electrode layer.

3. A method for manufacturing a semiconductor device including a diode, the method comprising:
preparing a silicon substrate configured so that:
the silicon substrate comprises an element field and an external field, a plurality of trenches extending in a striped pattern being provided in an upper surface of the silicon substrate in the element field, and the external field being adjacent to the element field in a longitudinal direction of the trenches,
each of the trench insulating films covers an inner surface of corresponding trench,
each of the trench electrodes is located in the corresponding trench of which inner surface is covered by the trench insulating film,
the silicon substrate comprises a plurality of inter-trench ranges, each of the inter-trench ranges being provided in each of positions between the two neighboring trenches in a plan view of the upper surface of the silicon substrate,
a plurality of specific inter-trench ranges is selected from among the plurality of the inter-trench ranges;
each of the specific inter-trench ranges comprises an anode region, a barrier region and a pillar region,
each of the anode regions is a p-type semiconductor region exposed on the upper surface of the silicon substrate,
each of the barrier regions is an n-type semiconductor region located under the anode region,
each of the pillar regions is an n-type semiconductor region extending from a position exposed on the upper surface of the silicon substrate to a position being in contact with the barrier region, and
the silicon substrate comprises a drift region located under the barrier regions, connected to the barrier regions directly or via a p-type semiconductor region, and having an impurity concentration lower than an impurity concentration of the barrier regions;
forming an interlayer insulating film covering the upper surface of the silicon substrate in the element filed and upper surfaces of the trench electrodes;
forming first contact holes and second contact holes penetrating the interlayer insulating film in each of the specific inter-trench ranges, each of the second contact holes being located in a position closer to the external field than the corresponding first contact hole, and each of the second contact holes having a width narrower than a width of the corresponding first contact hole, each of the pillar regions exposed on a bottom surface of the corresponding first contact hole, each of the anode regions exposed on a bottom surface of the corresponding second contact hole, and the pillar regions not exposed on the bottom surfaces of the second contact holes;
forming a first metal layer being in contact with the corresponding anode region by ohmic contact on the bottom surface of the corresponding second contact hole;
forming a second metal layer on the corresponding first metal layer by after the formation of the first metal layers;
forming an upper electrode layer on an upper surface of the interlayer insulating film, upper surfaces of the second metal layers, and inner surfaces of the first contact holes after the formation of the second contact holes, the upper electrode layer having a thickness greater than a thickness of the first metal layers, and the upper electrode layer being in contact with the pillar regions by Schottky contact in the first contact holes;
forming a protective insulating film covering an upper surface of the external field and a part of the upper electrode layer, the protective insulating film comprising an end portion extending on the upper electrode layer through a range located above the plurality of the second contact holes along a direction intersecting with the plurality of trenches;
forming an n-type cathode region located under the drift region, exposed on a lower surface of the silicon substrate, and having an impurity concentration higher than an impurity concentration of the drift region; and forming a lower electrode layer being in contact with the cathode region on the lower surface of the silicon substrate.

4. The method of claim 3, wherein the formation of the second metal layers comprises:
  depositing a material layer of the second metal layers on the upper surface of the interlayer insulating film, the inner surface of the corresponding first contact hole, and the inner surface of the corresponding second contact hole, the material layer having a thickness greater than half of the width of the second contact holes and smaller than half of the width of the first contact holes; and
  etching the first metal layers and the material layer so that an upper surface of the interlayer insulating film is exposed, bottom surfaces of the first contact holes are exposed, and the first metal layers and the second metal layers remain in a state in which each of the first metal layers and the second metal layers covers the bottom surface of the corresponding second contact hole.

5. The method of claim 3, further comprising:
  forming a surface electrode layer covering an upper surface of the upper electrode layer in a range not covered by the protective insulating film, the surface electrode layer further covering a part of the protective insulating film and configured of a metal different in kind from the upper electrode layer.

* * * * *